(12) United States Patent
Zeltser et al.

(10) Patent No.: US 7,770,282 B2
(45) Date of Patent: Aug. 10, 2010

(54) METHOD OF MAKING A MAGNETIC SENSING DEVICE HAVING AN INSULATOR STRUCTURE

(75) Inventors: Alexander M. Zeltser, San Jose, CA (US); Jinshan Li, San Jose, CA (US); Brian York, San Jose, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 1024 days.

(21) Appl. No.: 11/219,107

(22) Filed: Sep. 1, 2005

(65) Prior Publication Data

US 2007/0047153 A1    Mar. 1, 2007

(51) Int. Cl.
*G11B 5/127* (2006.01)
*B05D 3/04* (2006.01)

(52) U.S. Cl. ............... 29/603.14; 29/603.13; 427/130; 427/383.1

(58) Field of Classification Search ............ 29/603.13, 29/603.14; 360/324.2; 427/130, 372.2, 379, 427/383.1; 438/3, 653; 257/421
See application file for complete search history.

(56) References Cited

U.S. PATENT DOCUMENTS

| | | | |
|---|---|---|---|
| 5,936,293 A * | 8/1999 | Parkin | 257/421 X |
| 6,544,801 B1 * | 4/2003 | Slaughter et al. | 360/324.2 X |
| 6,548,114 B2 | 4/2003 | Mao et al. | |
| 6,709,767 B2 | 3/2004 | Lin et al. | |
| 2003/0030944 A1 | 2/2003 | Lin et al. | |
| 2003/0031894 A1 | 2/2003 | Lin et al. | |
| 2003/0053268 A1 | 3/2003 | Lin et al. | |

FOREIGN PATENT DOCUMENTS

JP    2000294854 A  * 10/2000

* cited by examiner

*Primary Examiner*—A. Dexter Tugbang
(74) *Attorney, Agent, or Firm*—John J. Oskorep, Esq.; Rambod Nader

(57) ABSTRACT

A magnetic sensing device for use in a magnetic head includes a sensor stack structure having a sensing layer structure and an insulator structure formed adjacent the sensing layer structure. The insulator structure includes a plurality of oxidized metallic sublayers, a plurality of nitrided metallic sublayers, or a plurality of oxynitrided metallic sublayers. The insulator structure may be a capping layer structure of a giant magnetoresistance sensor or, alternatively, a tunnel barrier layer structure of a tunneling magnetoresistance sensor or a magnetic random access memory. Advantageously, each treated metallic sublayer is sufficiently uniformly treated so as to increase the magnetoresistive effect and improve soft magnetic properties of the magnetic sensing device. A method for use in forming the magnetic sensing device of the present application includes the steps of forming a sensor stack structure which includes a sensing layer structure; depositing a metallic layer; performing, on the metallic layer, either an oxidation, nitridation, or oxynitridation process; and repeating the steps of depositing and performing one or more times to thereby form an insulator structure.

12 Claims, 13 Drawing Sheets

(ABS)

METHOD OF MAKING A MAGNETIC SENSING DEVICE HAVING AN INSULATOR STRUCTURE

BACKGROUND

1. Field of the Technology

This invention relates generally to magnetic sensing devices, and more particularly to the use of a plurality of oxidized, nitrided, or oxynitrided insulator structures, such as capping layer structures, in magnetic sensing devices.

2. Description of the Related Art

Computers often include auxiliary memory storage devices having media on which data can be written and from which data can be read for later use. A direct access storage device (disk drive) incorporating rotating magnetic disks are commonly used for storing data in magnetic form on the disk surfaces. Data is recorded on concentric, radially spaced tracks on the disk surfaces. Magnetic heads including read sensors are then used to read data from the tracks on the disk surfaces.

In high capacity disk drives, magnetoresistive read (MR) sensors, commonly referred to as MR heads, are the prevailing read sensors because of their capability to read data from a surface of a disk at greater linear densities than thin film inductive heads. An MR sensor detects a magnetic field through the change in the resistance of its MR sensing layer (also referred to as an "MR element") as a function of the strength and direction of the magnetic flux being sensed by the MR layer.

The conventional MR sensor operates on the basis of the anisotropic magnetoresistive (AMR) effect in which the MR element resistance varies as the square of the cosine of the angle between the magnetization of the MR element and the direction of sense current flow through the MR element. Recorded data can be read from a magnetic medium because the external magnetic field from the recorded magnetic medium (the signal field) causes a change in the direction of magnetization in the MR element, which in turn causes a change in resistance in the MR element and a corresponding change in the sensed current or voltage.

Another type of MR sensor is the giant magnetoresistance (GMR) sensor manifesting the GMR effect. In GMR sensors, the resistance of the MR sensing layer varies as a function of the spin-dependent transmission of the conduction electrons between magnetic layers separated by a non-magnetic layer (spacer) and the accompanying spin-dependent scattering which takes place at the interface of the magnetic and non-magnetic layers and within the magnetic layers. GMR sensors using only two layers of ferromagnetic material (e.g., nickel-iron, cobalt-iron, or nickel-iron-cobalt) separated by a layer of nonmagnetic material (e.g., copper) are generally referred to as spin valve (SV) sensors manifesting the SV effect. In an SV sensor, one of the ferromagnetic layers, referred to as the pinned layer, has its magnetization typically pinned by exchange coupling with an antiferromagnetic (AFM) layer (e.g., iridium-manganese, iridium-manganese-chromium, or platinum-manganese) layer. The pinning field generated by the AFM layer should be greater than demagnetizing fields to ensure that the magnetization direction of the pinned layer remains fixed during application of external fields (e.g. fields from bits recorded on the disk). The magnetization of the other ferromagnetic layer, referred to as the sensing layer, however, is not fixed and is free to rotate in response to the field from the information recorded on the magnetic medium (the signal field). A cap or capping layer of tantalum is typically formed over the sensor stack structure for protecting the sensor during and after its production.

Tunneling magnetoresistance (TMR) sensors have a configuration similar to GMR sensors, except that the magnetic layers of the sensor are separated by an insulating film thin enough to allow electron tunneling between the magnetic layers. The tunneling probability of an electron incident on the barrier from one magnetic layer depends on the character of the electron wave function and the spin of the electron relative to the magnetization direction in the other magnetic layer. As a consequence, the resistance of the TMR sensor depends on the relative orientations of the magnetization of the magnetic layers, exhibiting a minimum for a configuration in which the magnetizations of the magnetic layers are parallel and a maximum for a configuration in which the magnetizations of the magnetic layers are anti-parallel.

Another type of non-volatile magnetic device is a GMR and/or TMR based magnetic memory cell. An array of magnetic memory cells is often called magnetic random access memory (MRAM). The magnetic memory cell may include a sensing layer and a reference layer that is separated from the data layer by a tunnel barrier layer. These memory cells make use of GMR and TMR within the multi-layer structure. In a magnetic memory cell, a bit of data may be stored by "writing" into the data layer via one or more conducting leads (e.g., a bit line and a word line). The write operation is typically accomplished via a write current that sets the orientation of the magnetic moment in the sensing layer to a predetermined direction. Once written, the stored bit of data may be read by providing a read current through one or more conducting leads (e.g., a read line) to the reference layer. In at least one type of magnetic memory cell, the read current sets the orientation of the magnetic moment of the reference layer in a predetermined direction. For each memory cell, the orientations of the magnetic moments of the sensing layer and the reference layer are either parallel (in the same direction) or anti-parallel (in different directions) to each other giving rise to four different magnetic states. The degree of parallelism affects the resistance of the cell, and this resistance can be determined by sensing (e.g., via a sense amplifier) an output current produced by the memory cell in response to the read current through a GMR or TMR measurement.

There are several properties of magnetic sensing device which, if improved, will improve the performance and increase storage capacity. For example, it is generally desirable to increase the magnetoresistive effect ($\Delta R/R$) and decrease the coercivity ($H_{ce}$) of the sensing layer without substantially increasing the thickness of the sensor layers. An increase in the magnetoresistive effect equates to higher bit density (bits/square-inch of the rotating magnetic disk). The capping layer structure of an SV sensor, as well as the tunnel barrier layer of a TMR sensor has an effect on these sensor properties.

Referring now to the drawings wherein like reference numerals designate like or similar parts throughout the several views, FIGS. 1-3 illustrate a magnetic disk drive 30. Disk drive 30 includes a spindle 32 that supports and rotates a magnetic disk 34. Spindle 32 is rotated by a spindle motor 36 that is controlled by a motor controller 38. A slider 42 includes a combined read and write magnetic head 40 and is supported by a suspension 44 and actuator arm 46 that is rotatably positioned by an actuator 47. A plurality of disks, sliders, and suspensions may be employed in a large capacity direct access storage device (DASD) as shown in FIG. 3. Suspension 44 and actuator arm 46 are moved by actuator 47 to position slider 42 so that magnetic head 40 is in a transducing relationship with a surface of magnetic disk 34. When disk 34 is rotated by spindle motor 36, slider 42 is supported on a thin (typically, 0.05 μm) cushion of air (air bearing) between the surface of disk 34 and an air bearing surface (ABS) 48. Magnetic head 40 may then be employed for writing information to multiple circular tracks on the surface of disk 34, as well as for reading information there from. Processing circuitry 50 exchanges signals, representing such information, with head 40, provides spindle motor drive signals for rotating magnetic disk 34, and provides control signals to actuator 47 for moving slider 42 to various tracks. In FIG. 4, slider 42 is shown mounted to a suspension 44. The components described hereinabove may be mounted on a frame 54 of a housing 55, as shown in FIG. 3. FIG. 5 is an ABS view of slider 42 and magnetic head 40. Slider 42 has a center rail 56 that supports magnetic head 40, and side rails 58 and 60. Rails 56, 58 and 60 extend from a cross rail 62. With respect to rotation of magnetic disk 34, cross rail 62 is at a leading edge 64 of slider 42 and magnetic head 40 is at a trailing edge 66 of slider 42.

FIG. 6 is a side cross-sectional elevation view of a merged magnetic head 40, which includes a write head portion 70 and a read head portion 72. Read head portion 72 includes a giant magnetoresistance (GMR) read head which utilizes a spin valve (SV) sensor 74 of the present invention. FIG. 7 is an ABS view of FIG. 6. SV sensor 74 is sandwiched between nonmagnetic electrically insulative first and second read gap layers 76 and 78, and read gap layers 76 and 78 are sandwiched between ferromagnetic first and second shield layers 80 and 82. In response to external magnetic fields, the resistance of SV sensor 74 changes. A sense current $I_s$ conducted through the sensor causes these resistance changes to be manifested as potential changes. These potential changes are then processed as read back signals by processing circuitry 50 shown in FIG. 3.

Write head portion 70 of magnetic head 40 includes a coil layer 84 sandwiched between first and second insulation layers 86 and 88. A third insulation layer 90 may be employed for planarizing the head to eliminate ripples in the second insulation layer caused by coil layer 84. The first, second and third insulation layers are referred to in the art as an "insulation stack". Coil layer 84 and first, second and third insulation layers 86, 88 and 90 are sandwiched between first and second pole piece layers 92 and 94. First and second pole piece layers 92 and 94 are magnetically coupled at a back gap 96 and have first and second pole tips 98 and 100 which are separated by a write gap layer 102 at the ABS. Since second shield layer 82 and first pole piece layer 92 are a common layer, this head is known as a merged head. In a piggyback head an insulation layer is located between a second shield layer and a first pole piece layer. As shown in FIGS. 2 and 4, first and second solder connections 104 and 106 connect leads from SV sensor 74 to leads 112 and 114 on suspension 44, and third and fourth solder connections 116 and 118 connect leads 120 and 122 from the coil 84 (see FIG. 8) to leads 124 and 126 on suspension 44.

FIG. 9 is an enlarged isometric ABS illustration of read head 40 shown in FIG. 7 which includes SV sensor 74. First and second hard bias and lead layers 134 and 136 are connected to first and second side edges 138 and 139 of SV sensor 74. This connection is known in the art as a contiguous junction and is fully described in commonly assigned U.S. Pat. No. 5,018,037 which is incorporated by reference herein. First hard bias and lead layers 134 include a first hard bias layer 140 and a first lead layer 142, and second hard bias and lead layers 136 include a second hard bias layer 144 and a second lead layer 146. Hard bias layers 140 and 144 cause magnetic fields to extend longitudinally through SV sensor 74 for stabilizing the magnetic domains therein. SV sensor 74 and first and second hard bias and lead layers 134 and 136 are located between the nonmagnetic electrically insulative first and second read gap layers 76 and 78. First and second read gap layers 76 and 78 are, in turn, located between ferromagnetic first and second shield layers 80 and 82.

FIG. 10 shows an ABS illustration of a typical multi-layered structure of a SV sensor 200 located between first and second read gap layers 76 and 78. This read element may be utilized in the slider and disk drive shown and described above in relation to FIGS. 1-8. SV sensor 200 includes a non-magnetic electrically conductive spacer (S) layer 202 which is located between an antiparallel (AP) pinned layer structure 204 and a sensing layer structure 206. AP pinned layer structure 204 includes an antiparallel coupling (APC) layer 208 which is located between first and second ferromagnetic AP pinned layers (AP1) and (AP2) 210 and 212. First AP pinned layer 210 is exchange coupled to an antiferromagnetic (AFM) pinning layer 214 which pins a magnetic moment 215 of first AP pinned layer 210 perpendicular to the ABS in a direction out of or into sensor 200, as shown in FIG. 10. By strong antiparallel coupling between first and second AP pinned layers 210 and 212, a magnetic moment 216 of second AP pinned layer 212 is antiparallel to magnetic moment 215. A seed layer (SL) 222 may be provided between first read gap layer 76 and pinning layer 214 for promoting a desirable texture of the layers deposited thereon. Sensing layer structure 206 includes first and second free ferromagnetic layers (F1) and (F2) 224 and 226, with first sensing layer 224 interfacing spacer layer 202. Sensing layer structure 206 has a magnetic moment 228 which is oriented parallel to the ABS and to the major planes of the layers in a direction from right to left, or from left to right, as shown in FIG. 10. A capping layer structure ($C_{10}$) 1002 is formed over sensing layer structure 206 for protecting the sensor.

When a signal field from the rotating magnetic disk rotates magnetic moment 228 into the sensor, magnetic moments 228 and 216 become more antiparallel which increases the resistance of the sensor to the sense current ($I_S$). When a signal field rotates magnetic moment 228 of sensing layer structure 206, magnetic moments 228 and 216 become more parallel which reduces the resistance of sensor 200 to the sense current ($I_S$). These resistance changes are processed as playback signals by processing circuitry (i.e. processing circuitry 50 of FIG. 3).

The following materials are examples of materials which may be utilized in multilayered SV sensor 200 of FIG. 10. Seed layer 222 may be made of nickel-iron-chromium (NiFeCr), or alternatively any suitable material; AFM layer 214 may be made of platinum-manganese (PtMn) or alternatively of iridium-manganese (IrMn); AP pinned layers 210 and 212 may be made of cobalt-iron (CoFe); APC layer 208 may be made of ruthenium (Ru); first and second sensing layers 224 and 226 may be made of CoFe, nickel-iron (NiFe), or alternatively any suitable material; spacer layer 202 may be made of copper (Cu); and capping layer structure 1002 is a combination of tantalum (Ta) metal, tantalum oxide ($Ta_2O_5$), and diffused oxygen (O). A Cu diffusion barrier layer may be located over and adjacent second sensing layer 226 for effectively increasing conduction electrons back into the mean free path of sensing layer structure 206. Thicknesses of particular materials may be 30 Å of NiFeCr for seed layer 222; 150 Å of PtMn for AFM layer 214, 30 Å of CoFe for first AP pinned layer 210; 4.5 Å of Ru for APC layer 208; 30 Å of CoFe for second AP pinned layer 212; 20 Å of Cu for spacer layer 202; 15 Å of CoFe for first sensing layer 224; 18 Å of NiFe for second sensing layer 226; and 40 Å of a combination of Ta, $Ta_2O_5$, and diffused oxygen for capping layer structure 1002.

Conventional methods of making capping layer structure 1002 of FIG. 10 involve the steps of depositing a metallic layer (e.g. between about 20 Å and about 40 Å) in-situ and subsequently exposing that metallic layer to oxygen ex-situ to ambient atmosphere. The depth of oxygen (O) diffusion into the metallic layer is difficult to precisely control. Furthermore, the form in which the diffused oxygen is found (if at all) throughout such layer is of importance to sensor performance.

The oxygen may diffuse only to a certain depth into the metallic layer since the ex-situ oxidation is from the top. Only an upper portion ($C_{10}3$) 1008 of the metallic layer may be sufficiently oxidized from the ex-situ oxidation. In upper portion 1008, the diffused oxygen may be strongly bonded to the Ta in the Ta lattice due to the formation of Ta—O valence bonds, as in the stable compound tantalum oxide ($Ta_2O_5$). In a middle portion ($C_{10}2$) 1006 of the metallic layer, the diffused oxygen may be loosely bonded in a lower concentration than that found in upper portion 1008, probably in interstitial sites of the Ta lattice. Non-bonded Ta atoms may also be present in middle portion 1006 of the metallic layer. In a lower portion ($C_{10}1$) 1004 of the metallic layer, diffused oxygen may not be found in any appreciable concentration (i.e. lower portion 1004 may be substantially pure Ta). As in middle portion 1006, non-bonded Ta atoms may be present in lower portion 1004. This non-bonded Ta may diffuse into underlying ferromagnetic materials, such as sensing layer structure 206, and therefore create a magnetic dead layer within the ferromagnetic materials. While upper, middle, and lower portions 1008, 1006, and 1004 are shown with distinct interfaces between them, clear boundaries may not exist. As apparent, the atomic percent oxygen in capping layer structure 1002 is not uniform throughout from top to bottom.

If the ex-situ oxidation is thorough, the thoroughly-diffused oxygen in the metallic layer will be strongly bonded to all of the Ta in the Ta lattice due to the formation of Ta—O valence bonds, as in the stable compound $Ta_2O_5$. This Ta—O valence bonding increases the thickness of the layer by a factor of about 2½ times (i.e. $Ta_2O_5$ layer thickness is 2.5 times thicker than the Ta layer thickness). However, underlying ferromagnetic materials, such as sensing layer structure 206 (i.e. for top-type GMR magnetic sensing devices such as in FIG. 10) or AP pinned layer structure 204 (i.e. for bottom-type GMR magnetic sensing devices) may become partially oxidized and form a magnetically "dead" layer from the diffusion of non-bonded oxygen into it. If capping layer structure 1002 is sufficiently oxidized uniformly from top to bottom without un-bonded Ta or oxygen diffusion into underlying ferromagnetic materials, the sensor properties may be enhanced as mentioned above. Uniform oxidation performed subsequent to metallic layer deposition is practical with metallic layer thicknesses of about 10 Å or less, which is below conventional thickness requirements of between about 20 Å and about 40 Å.

Accordingly, what are needed are SV sensors having capping layer structures which help provide an increased magnetoresistive effect while preserving good soft magnetic properties of the sensing layer. What are also needed are methods in which to sufficiently oxidize metallic materials of a capping layer structure without affecting the underlying sensing layer.

FIG. 11 shows an ABS illustration of a typical multi-layered structure of a tunneling magnetoresistance (TMR) type SV sensor, typically referred to as a magnetic tunnel junction (MTJ) type SV sensor 1100 of the prior art. This read element may be utilized in the slider and disk drive shown and described above in relation to FIGS. 1-8. MTJ type SV sensor 1100 is formed between and in contact with lower (S1) and upper (S2) shield layers 1172 and 1174, which serve as electrically conductive leads (L1 and L2) for the sensor.

MTJ type SV sensor 1100 includes, from bottom to top, a seed (SL) layer 1120, an antiferromagnetic (AFM) pinning layer 1114, an AP pinned layer structure 1104, an insulating tunnel barrier ($B_{11}$) layer structure 1132, a sensing (F) layer structure 1124, and a capping (C) layer structure 1102. Sensing layer structure 1124 is formed underneath capping layer structure 1102 and over and adjacent insulating tunnel barrier layer structure 1132. AP pinned layer structure 1104 is formed beneath insulating tunnel barrier layer structure 1132 and over and adjacent AFM pinning layer 1114. AFM pinning layer 1114 is formed beneath pinned layer structure 1104 and over and adjacent to seed layer structure 1120. Seed layer structure 1120 is formed over lower shield layer 1172 and underneath AFM pinning layer 1114 for promoting an improved texture of the layers deposited thereon.

The following materials are examples of materials which may be utilized in multilayered MTJ type SV sensor 1100. The first and second shields 1172 and 1174 may be made of any electrically conducting material such as NiFe; seed layer 1120 may be made of any suitable material such as NiFeCr, NiFe, Ta, or Ru; AFM layer 1114 may be made of any suitable material such as PtMn, IrMn or iridium-manganese-chromium (IrMnCr); AP pinned layers 1110 and 1112 may be made of Co or CoFe; APC layer 1108 may be made of Ru; tunnel barrier layer structure 1132 is a made of $TaO_x$, $AlO_x$, $MgO_x$, and $TiO_x$, where x indicates varying oxygen content throughout the thickness of the barrier layer and deviating stoichiometric composition; sensing layer structure 1124 may be made of CoFe and NiFe; and capping layer structure 1102 may be made of Ta. Thicknesses of particular materials may be 200 Å for first and second shield layers; 30 Å of NiFeCr for seed layer 1120; 150 Å of PtMn for AFM layer 1114, 30 Å of CoFe for first AP pinned layer 1110; 8 Å of Ru for APC layer 1108; 30 Å of CoFe for second AP pinned layer 1112; 10 Å $TaO_x$, for tunnel barrier layer structure 1132; 15 Å of CoFe and 15 Å of NiFe for sensing layer structure 1124; and 40 Å of Ta for capping layer structure 1102.

Conventional methods of making tunnel barrier layer structure 1132 of FIG. 11 involve the steps of depositing a metallic layer and subsequently in-situ oxidizing that metallic layer from the top down. The depth of oxygen (O) diffusion into the metallic layer is difficult to precisely control and the oxidation must be performed gently in order not to damage underlying ferromagnetic materials. Furthermore, the form in which the diffused oxygen is found (if at all) throughout such a layer is of importance to sensor performance.

The oxygen may diffuse only to a certain depth into the metallic layer since the oxidation is from the top. Only an upper portion ($B_{11}3$) 1138 of the metallic layer may be sufficiently oxidized from the natural oxidation. In upper portion 1138, the diffused oxygen may be strongly bonded to the Ta in the Ta lattice due to the formation of Ta—O valence bonds, as in the stable compound tantalum oxide ($Ta_2O_5$). This Ta—O valence bonding increases the thickness of upper portion 1138 of the layer by a factor of about 2½ times which may limit oxygen diffusion to the remaining portions of the layer. In a middle portion ($B_{11}2$) 1136 of the metallic layer, the diffused oxygen may be loosely bonded in a lower concentration than that found in upper portion 1138, probably in interstitial sites of the Ta lattice. This loosely bonded oxygen also increases the thickness of middle portion 1136 by a varying factor depending on the diffused oxygen concentration. In a lower portion ($B_{11}$) 1134 of the metallic layer, diffused oxygen may not be found in any appreciable concentration (i.e., lower portion 1134 may be substantially pure Ta), therefore creating a magnetically dead layer. While upper, middle, and lower portions 1138, 1136, and 1134 are shown with distinct interfaces between them, clear boundaries may not exist. As apparent, the atomic percent oxygen in tunnel barrier layer structure 1132 is not uniform throughout from top to bottom.

If the in-situ oxidation is thorough, the thoroughly-diffused oxygen in the metallic layer will be strongly bonded to all of the Ta in the Ta lattice due to the formation of Ta—O valence bonds, as in the stable compound $Ta_2O_5$. This Ta—O valence bonding increases the thickness of the layer by a factor of about 2½ times. However, underlying ferromagnetic materials, such as second pinned layer 1112 (i.e. for bottom-type TMR sensing devices such as in FIG. 11) or sensing layer structures (i.e. for top-type TMR sensing devices), may suffer microstructural changes, as in the formation of a magnetically dead layer from the diffusion of non-bonded excess oxygen into it. If tunnel barrier layer structure 1132 is sufficiently oxidized uniformly from top to bottom without un-bonded Ta or oxygen diffusion into underlying ferromagnetic materials, the sensor properties may be enhanced as mentioned above. This gentle sufficient uniform oxidation is practical with metallic layer thicknesses of about 5 Å or less, which is below conventional metallic layer thicknesses of between about 6 Å and about 10 Å.

Accordingly, what are needed are sensors which overcome the deficiencies of the prior art, as well as methods of making the same.

SUMMARY

A magnetic sensing device for use in a magnetic head includes a sensor stack structure having a sensing layer structure and an insulator structure formed adjacent the sensing layer structure. The insulator structure includes a plurality of oxidized metallic sublayers, a plurality of nitrided metallic sublayers, or a plurality of oxynitrided metallic sublayers. The insulator structure may be a capping layer structure of a giant magnetoresistance sensor or, alternatively, a tunnel barrier layer structure of a tunneling magnetoresistance sensor or a magnetic random access memory. Advantageously, each treated metallic sublayer is sufficiently uniformly treated so as to increase the magnetoresistive effect and improve soft magnetic properties of the magnetic sensing device.

A method for use in forming the magnetic sensing device of the present application includes the steps of forming a sensor stack structure which includes a sensing layer structure; depositing a metallic layer; performing, on the metallic layer, either an oxidation, nitridation, or oxynitridation process; and repeating the steps of depositing and performing one or more times to thereby form an insulator structure.

BRIEF DESCRIPTION OF THE DRAWINGS

For a fuller understanding of the nature and advantages of the present invention, as well as the preferred mode of use, reference should be made to the following detailed description read in conjunction with the accompanying drawings.

DETAILED DESCRIPTION OF THE PREFERRED EMBODIMENTS

A magnetic sensing device for use in a magnetic head includes a sensor stack structure having a sensing layer structure and an insulator structure formed adjacent the sensing layer structure. The insulator structure includes a plurality of oxidized metallic sublayers, a plurality of nitrided metallic sublayers, or a plurality of oxynitrided metallic sublayers. The insulator structure may be a capping layer structure of a magnetoresistive read sensor or, alternatively, a tunnel barrier layer structure of a tunneling magnetoresistive sensor or magnetic random access memory. Advantageously, the insulator structure enhances the magnetoresistive effect and soft magnetic properties of the magnetic sensing device. A method for use in forming the magnetic sensing device of the present application includes the steps of forming a sensor stack structure which includes a sensing layer structure; depositing a metallic layer; performing, on the metallic layer, either an oxidation, nitridation, or oxynitridation process; and repeating the steps of depositing and performing one or more times to thereby form an insulator structure.

The following description is the best embodiment presently contemplated for carrying out the present invention. This description is made for the purpose of illustrating the general principles of the present invention and is not meant to limit the inventive concepts claimed herein.

Capping Layer Structure Which Includes A Plurality Of Oxidized Metallic Sublayers. In order to achieve conventional thicknesses of capping layer structures while optimizing sensor properties and avoiding damage to underlying ferromagnetic materials, a plurality of relatively thin metallic layers, where each metallic layer is subsequently oxidized after its respective deposition, is utilized in the present application.

Figure 12:
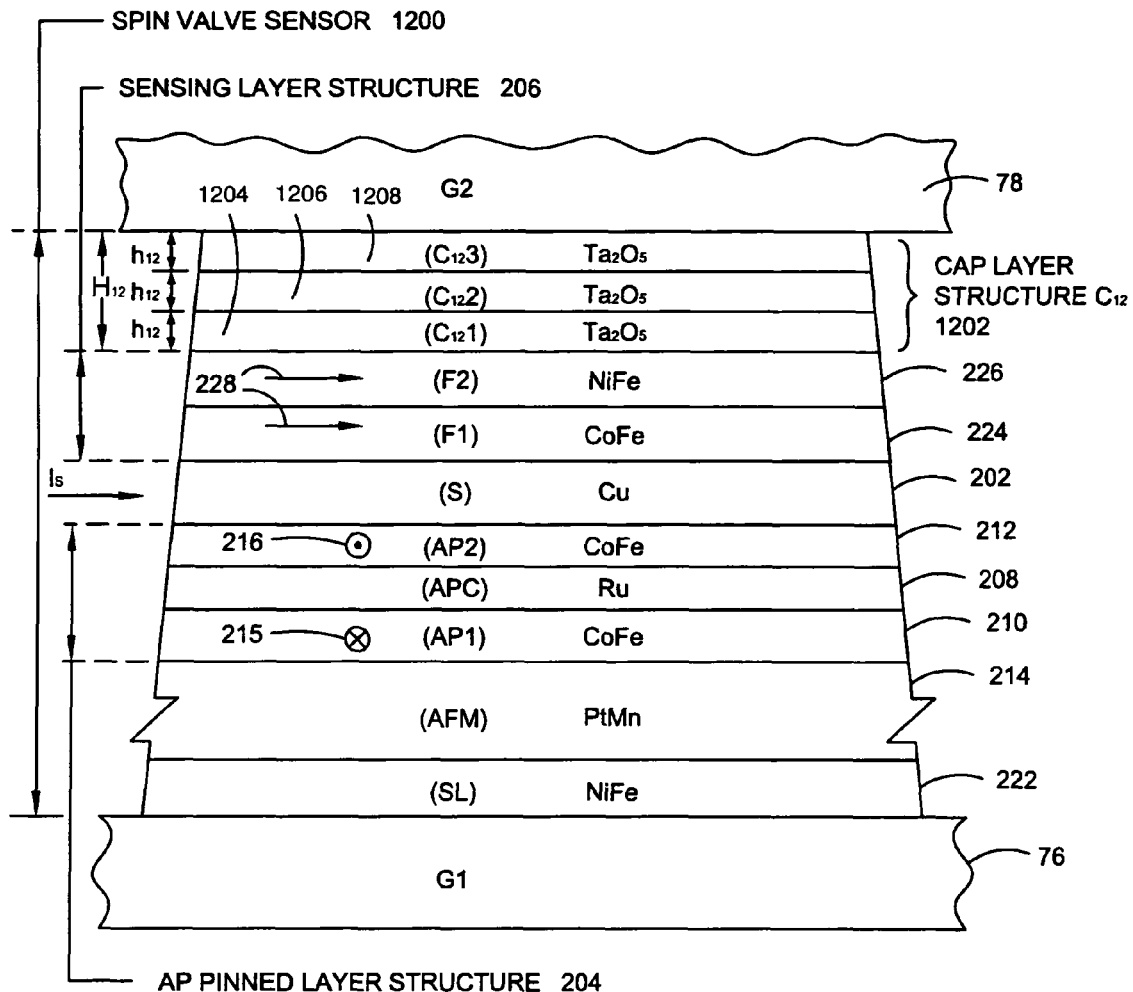
FIG. 12 is an ABS illustration of an example of a multi-layer structure of a CIP type SV sensor having a capping layer structure of the present application.

FIG. 12 shows an ABS illustration of an SV sensor 1200 of the present application which overcomes the deficiencies of the prior art. SV sensor 1200 is similar to that shown and described in relation to FIG. 10; however, a capping layer structure 1202 of SV sensor 1200 is a specular reflective insulator structure which has a plurality of oxidized metallic sublayers 1204, 1206, and 1208. These sublayers are oxidized separate and apart from each other therefore resulting in precise control over respective sublayer and capping layer structure characteristics. Advantageously, each oxidized metallic sublayer 1204, 1206, and 1208 is sufficiently uniformly oxidized so as to increase the giant magnetoresistive effect and improve soft magnetic properties of SV sensor 1200. This SV sensor 1200 may be embodied in a magnetic head and disk drive as described earlier in relation to FIGS. 1-9.

In general, the capping layer structure of the present application has n sublayers, preferably each with an equal thickness $h_{12}$, such that $n*h_{12}$ is equal to a total thickness $H_{12}$. Total thickness $H_{12}$, sublayer thickness $h_{12}$, and the number of sublayers n may be chosen by design to give suitable desired effects on the magnetoresistive effect and other soft magnetic properties of the sensor. In the exemplary embodiment of FIG. 12, capping layer structure 1202 has three sublayers 1204, 1206, and 1208. Here, capping layer structure 1202 has a total thickness $H_{12}$ corresponding to about 50 Å and each sublayer 1204, 1206, and 1208 of capping layer structure 1202 has an equal thickness $h_{12}$ corresponding to about 16⅔ Å (3*16⅔ Å=50 Å). Thus, capping layer structure 1202 may have any suitable number of sublayers such as two, four, or more sublayers. Total thickness $H_{12}$ may be within a wide range of values (e.g. about 10 Å to about 100 Å), and thickness $h_{12}$ may also be within a wide range of values (e.g. about 2.5 Å to about 25 Å). As a further example, the capping layer structure may have four (4) sublayers where each sublayer has a thickness of about 12.5 Å for a total thickness of about 50 Å. As another example, the capping layer structure may have two (2) sublayers where each sublayer has a thickness of about 25 Å for a total thickness of about 50 Å. As discussed, preferably the thickness of each sublayer is the same; however, the thickness of each sublayer may alternatively be different.

In the exemplary embodiment of FIG. 12, capping layer structure 1202 is a uniform structure of oxidized metal, namely $Ta_2O_5$. Each sublayer 1204, 1206, and 1208 is sufficiently independently oxidized from top to bottom into $Ta_2O_5$ so that the entire capping layer structure 1202 is a uniform structure of $Ta_2O_5$ from top to bottom. The diffused oxygen is strongly bonded to the Ta in the Ta lattice due to the formation of Ta—O valence bonds. Since each sublayer 1202, 1206, and 1208 has uniform atomic percent oxygen from top to bottom, the entire capping layer structure 1202 has uniform atomic percent oxygen from top to bottom. Preferably, sublayers 1204, 1206, and 1208 of capping layer structure 1202 are formed in direct contact with each other with no intervening layers or materials between them. With appropriate characterization techniques, such as those described later below, the distinct interfaces between sublayers 1204, 1206, and 1208 of capping layer structure 1202 may be observed. Alternatively, intervening layers may exist between sublayers 1204, 1206, and 1208.

As shown in FIG. 12, capping layer structure 1202 is formed over and adjacent ferromagnetic materials of sensing layer structure 206. In particular, capping layer structure 1202 is shown on top of and in contact with sensing layer structure 206. Preferably, however, a diffusion barrier layer is formed between sensing layer structure 206 and capping layer structure 1202. This diffusion barrier layer may substantially reduce the number and extent of microstructural changes caused by oxygen diffusion when an oxidation process is used to form capping layer structure 1202. The proposed diffusion barrier layer may be made from copper (Cu) or any other suitable nonmagnetic material. A desired thickness of the proposed diffusion barrier layer ranges from about 1 Å to about 10 Å and more preferably 6 Å in the present embodiment. Additional or other intervening layers may exist if needed.

Although Ta was discussed in relation to capping layer structure 1202, any suitable material may be used and capping layer structure 1202 still performs its appropriate function. Instead of Ta, for example, the metal used in the capping layer structure of the present application may be or include hafnium (Hf), zirconium (Zr), titanium (Ti), aluminum (Al), magnesium (Mg), yttrium (Y), chromium (Cr), niobium (Nb), molybdenum (Mo), tungsten (W), vanadium (V), rhenium (Re), scandium (Sc), or silicon (Si). As discussed, preferably the material of each sublayer is the same; however, the material of each sublayer may alternatively be different. Furthermore, combinations like alloys of two or more metals may be used. In binary and multi-component systems, such as the Ta and oxygen system, intermediate phases (stable or metastable) may occur. Thermodynamically, the composition of any such phase is variable and they are called stoichiometric phases. $Ta_2O_5$ is the preferred stoichiometric phase in the present application due to its high stability and specular reflectivity. However, other stoichiometric phases in the Ta and oxygen system, such as tantalum monoxide (TaO) and tantalum dioxide ($TaO_2$) may be present as alternatives.

Instead of an oxide of metal (e.g. $Ta_2O_5$), a nitride of metal (e.g., TaN, $Ta_2N$, $Ta_3N_5$, etc.) may be utilized in capping layer structure 1202. In this embodiment, each sublayer 1204, 1206, and 1208 is sufficiently independently nitrided from top to bottom into $Ta_2N$, so that the entire capping layer structure 1202 is uniform $Ta_2N$ from top to bottom. The diffused nitrogen is strongly bonded to the Ta in the Ta lattice due to the formation of Ta—N valence bonds. Since each sublayer 1204, 1206, and 1208 has uniform atomic percent nitrogen from top to bottom, the entire capping layer structure 1202 has uniform atomic percent nitrogen from top to bottom.

An oxynitride of metal (e.g. TaON, etc.) may alternatively be used in capping layer structure 1202. In this embodiment, each sublayer 1204, 1206, and 1208 is sufficiently independently oxidized/nitrided from top to bottom into TaON, so that the entire capping layer structure 1202 is uniform TaON from top to bottom. The diffused oxygen and nitrogen are strongly bonded to the Ta in the Ta lattice due to the formation of Ta—O—N valence bonds. Since each sublayer 1202, 1204, and 1206 has a uniform atomic percent oxygen and uniform atomic percent nitrogen from top to bottom, the entire capping layer structure 1202 has uniform atomic percent oxygen and atomic percent nitrogen from top to bottom. Further, the sublayers of capping layer structures of the present application may vary in composition being combinations of oxides, nitrides, and oxynitrides.

Tunnel Barrier Layer Structure Which Includes A Plurality Of Oxidized Metallic Sublayers. In order to achieve conventional thicknesses of tunnel barrier layer structures while optimizing sensor properties and avoiding damage to underlying ferromagnetic materials, a plurality of relatively thin metallic layers, where each metallic layer is subsequently in-situ oxidized after its respective deposition, is utilized in the present application.

Figure 11:
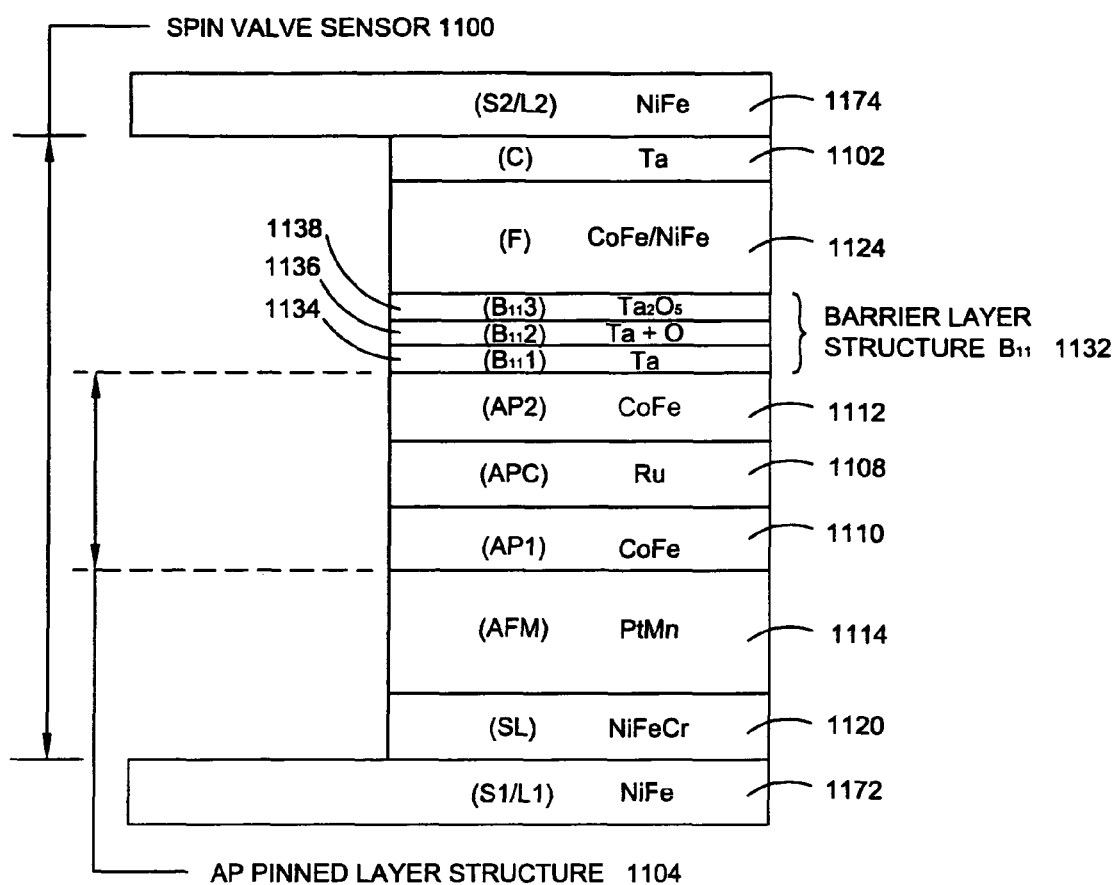
FIG. 11 is an ABS illustration of a typical multi-layer structure of a magnetic tunnel junction (MTJ) type SV sensor having a tunnel barrier layer structure.
Figure 13:
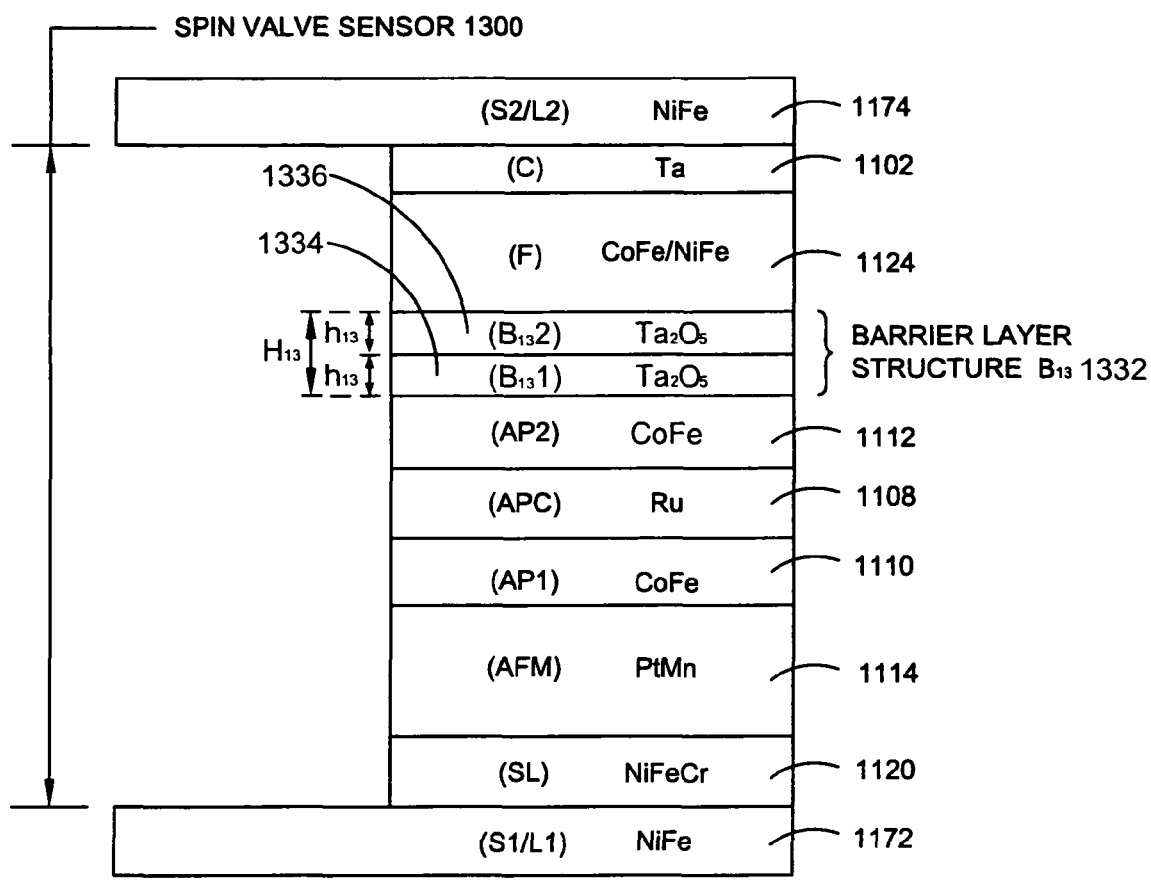
FIG. 13 is an ABS illustration of an example of a multi-layer structure of a MTJ type SV sensor having a tunnel barrier layer structure of the present application.

FIG. 13 shows an ABS illustration of an MTJ type SV sensor 1300 of the present application which also overcomes the deficiencies of the prior art. MTJ type SV sensor 1300 is similar to that shown and described in relation to FIG. 11; however, a tunnel barrier layer structure 1332 of MTJ type SV sensor 1300 is an insulator structure which has a plurality of oxidized metallic sublayers 1334 and 1336. These sublayers are gently oxidized separate and apart from each other therefore resulting in precise control over respective sublayer and tunnel barrier layer structure characteristics. Advantageously, each oxidized metallic sublayer 1334 and 1336 is sufficiently uniformly oxidized so as to increase the tunneling magnetoresistive effect and improve soft magnetic properties of SV sensor 1300. This SV sensor 1300 may be embodied in a magnetic head and disk drive as described earlier in relation to FIGS. 1-9.

Tunnel barrier layer structure 1332 has a total thickness $H_{13}$ corresponding to about 10 Å and each sublayer 1334 and 1336 of tunnel barrier layer structure 1332 has an equal thickness $h_{13}$ corresponding to about 5 Å (2*5 Å=10 Å). As suggested, tunnel barrier layer structure 1332 may have any suitable number of sublayers, such as two or more sublayers. Total thickness $H_{13}$ may be within a range of values (e.g. about 6 Å to about 20 Å), and thickness $h_{13}$ may also be within a range of values (e.g. about 3 Å to about 10 Å). As discussed, preferably the thickness of each sublayer is the same; however, the thickness of each sublayer may alternatively be different.

In the exemplary embodiment, tunnel barrier layer structure 1332 is a uniform structure of oxidized metal, namely $Ta_2O_5$. Each sublayer 1334 and 1336 is sufficiently independently oxidized from top to bottom into $Ta_2O_5$, so that the entire tunnel barrier layer structure 1332 is a uniform structure of $Ta_2O_5$ from top to bottom. The diffused oxygen is strongly bonded to the Ta in the Ta lattice due to the formation of Ta—O valence bonds. Since each sublayer 1334 and 1336 has uniform atomic percent oxygen from top to bottom, the entire tunnel barrier layer structure 1332 has uniform atomic percent oxygen from top to bottom. Preferably, sublayers 1334 and 1336 of tunnel barrier layer structure 1332 are formed in direct contact with each other with no intervening layers or materials between them. Using appropriate characterization techniques described later, distinct interfaces between sublayers 1334 and 1336 are observed. Alternatively, intervening layers may exist between sublayers 1334 and 1336.

Although Ta was discussed in relation to tunnel barrier layer structure 1332, any suitable material may be used and tunnel barrier layer structure 1332 will still perform its appropriate function. Instead of Ta, for example, the metal used in tunnel barrier layer structure 1332 may be or include Hf, Zr, Ti, Al, Mg, Be (beryllium), Y, Cr, Nb, Mo, W, V, Re, Sc, or Si, as examples. As discussed, the material of each sublayer is preferably the same; however, the material of each sublayer may alternatively be different. Furthermore, combinations like alloys of two or more metals may be used. In binary and multi-component systems, such as the Ta and oxygen system, intermediate phases (stable or metastable) may occur. Thermodynamically, the composition of any such phase is variable and they are called stoichiometric phases. $Ta_2O_5$ is the preferred stoichiometric phase due to its high stability and specular reflectivity. Other stoichiometric phases in the Ta and oxygen system, such as TaO and $TaO_2$, may be present as alternatives.

Instead of an oxide of metal (e.g. $Ta_2O_5$), a nitride of metal (e.g. TaN, $Ta_2N$, $Ta_3N_5$, etc.) may be utilized in tunnel barrier layer structure 1332. In this embodiment, each sublayer 1334 and 1336 is sufficiently independently nitrided from top to bottom into $Ta_2N$, so that the entire tunnel barrier layer structure 1332 is uniform $Ta_2N$ from top to bottom. The diffused nitrogen is strongly bonded to the Ta in the Ta lattice due to the formation of Ta—N valence bonds. Since each sublayer 1334 and 1336 has uniform atomic percent nitrogen from top to bottom, the entire tunnel barrier layer structure 1332 has uniform atomic percent nitrogen from top to bottom.

An oxynitride of metal (e.g. TaON, etc.) may alternatively be used in tunnel barrier layer structure 1332. In this embodiment, each sublayer 1334 and 1336 is sufficiently independently oxidized/nitrided from top to bottom into TaON, so that the entire tunnel barrier layer structure 1332 is uniform TaON from top to bottom. The diffused oxygen and nitrogen are strongly bonded to the Ta in the Ta lattice due to the formation of Ta—O-N valence bonds. Since each sublayer 1334 and 1336 has a uniform atomic percent oxygen and uniform atomic percent nitrogen from top to bottom, the entire tunnel barrier layer structure 1332 has uniform atomic percent oxygen and atomic percent nitrogen from top to bottom. As a further variation, the sublayers of tunnel barrier layer structures of the present application may vary in composition being combinations of oxides, nitrides, and oxynitrides.

Another type of non-volatile magnetic device is a GMR and/or TMR based magnetic memory cell. An array of magnetic memory cells is often called magnetic random access memory (MRAM). The magnetic memory cell may include a sensing layer and a reference layer that is separated from the data layer by a tunnel barrier layer like that described above in relation to FIG. 13. These layers may be referred to as a sensor stack structure. These memory cells make use of GMR and TMR within the multi-layer structure. In a magnetic memory cell, a bit of data may be stored by "writing" into the data layer via one or more conducting leads (e.g., a bit line and a word line). The write operation is typically accomplished via a write current that sets the orientation of the magnetic moment in the sensing layer to a predetermined direction.

Once written, the stored bit of data may be read by providing a read current through one or more conducting leads (e.g., a read line) to the reference layer. In at least one type of magnetic memory cell, the read current sets the orientation of the magnetic moment of the reference layer in a predetermined direction. For each memory cell, the orientations of the magnetic moments of the sensing layer and the reference layer are either parallel (in the same direction) or anti-parallel (in different directions) to each other giving rise to four different magnetic states. The degree of parallelism affects the resistance of the cell, and this resistance can be determined by sensing (e.g., via a sense amplifier) an output current produced by the memory cell in response to the read current through a GMR or TMR measurement.

Again, the use of such inventive structures increases the magnetoresistive effect of a read sensor essentially without degrading the soft magnetic properties. For example, with use of the capping layer structure of the present application, the giant magnetoresistive effect of the SV sensor may be increased between about 0.5-2.4% given a fixed sensing layer structure thickness. The additional use of the diffusion barrier layer may increase the magnetoresistive effect about a further 0.5% to about 1.5% given a fixed sensing layer structure thickness.

Table 1 provides measurement data for various properties of SV sensors with and without Ta—O sublayers in the capping layer structure. In column two, Ta was oxidized with an ex-situ oxidation process. This capping layer structure has one 20.0 Å thick layer of Ta, which after ex-situ oxidation in air results in about a 35 Å thick layer consisting of a combination of Ta, Ta—O solid solution with diffused oxygen in Ta interstitial sites, and $Ta_2O_5$. Furthermore, a 6.0 Å Cu diffusion barrier layer formed between and adjacent the sensing layer structure and the capping layer structure was used. In column three, Ta sublayers were oxidized with a plasma oxidation process. This capping layer structure has four 12.5 Å thick sublayers of $Ta_2O_5$ for a total thickness of 50 Å. Furthermore, a 6.0 Å Cu diffusion barrier layer formed between the sensing layer structure and the capping layer structure was used in this embodiment. In Table 1, ΔR/R is the giant magnetoresistive effect, $R_{max}$ is the sheet resistance of the SV sensor, $H_f$ is the interlayer coupling, $H_{ce}$ is the easy coercivity of the sensing layer, and $H_{ch}$ is the hard-axis coercivity of the sensing layer.

TABLE 1

SV properties of a conventional Ta—O capping layer structure and a multilayer $Ta_2O_5$ capping layer structure of the present application.

| | Capping Layer Structure | |
|---|---|---|
| | Single Ta—O Layer | Multilayer Ta—O (Plasma) |
| Sensing Layer Composition | $Co_{85}Fe_{15}$ | $Co_{85}Fe_{15}$ |
| Sensing Layer Thickness (Å) | 19 | 17 |
| ΔR/R (%) | 14.09 | 16.56 |
| $R_{max}$ (Ω/sq.) | 25.18 | 24.40 |
| $H_f$ (Oe) | −11.96 | −11.34 |
| $H_{ce}$ (Oe) | 3.39 | 5.51 |
| $H_{ch}$ (Oe) | 1.00 | 2.50 |

In general, the specular reflective capping layer structures of the present application result in maximized giant magnetoresistive effect ΔR/R and minimized sheet resistance $R_{max}$. As apparent from the Table 1 data, the giant magnetoresistive effect of the SV sensor having the multilayer tantalum oxide capping layer structure using the plasma oxidation process increases by approximately 2.4% over the SV sensor with the single tantalum oxide layer in the capping layer structure. The $R_{max}$ value of the SV sensor having the multilayer tantalum oxide capping layer structure using the plasma oxidation process decreases by approximately 0.8 Ω/sq over the SV sensor with the single tantalum oxide layer in the capping layer structure due to formation of a specular reflective $Ta_2O_5$ capping layer. As is further evident from Table 1, the sensing layer still exhibits good soft magnetic properties, with $H_{ce}$=5.5 Oe and $H_{ch}$=2.5 Oe.

One skilled in the art will understand how to identify these capping layer structures and associated individual sublayers. Some characterization techniques include Auger electron spectroscopy (AES), atom-probe field-ion microscopy (AP-FIM), and secondary ion mass spectroscopy (SIMS).

Figure 14:
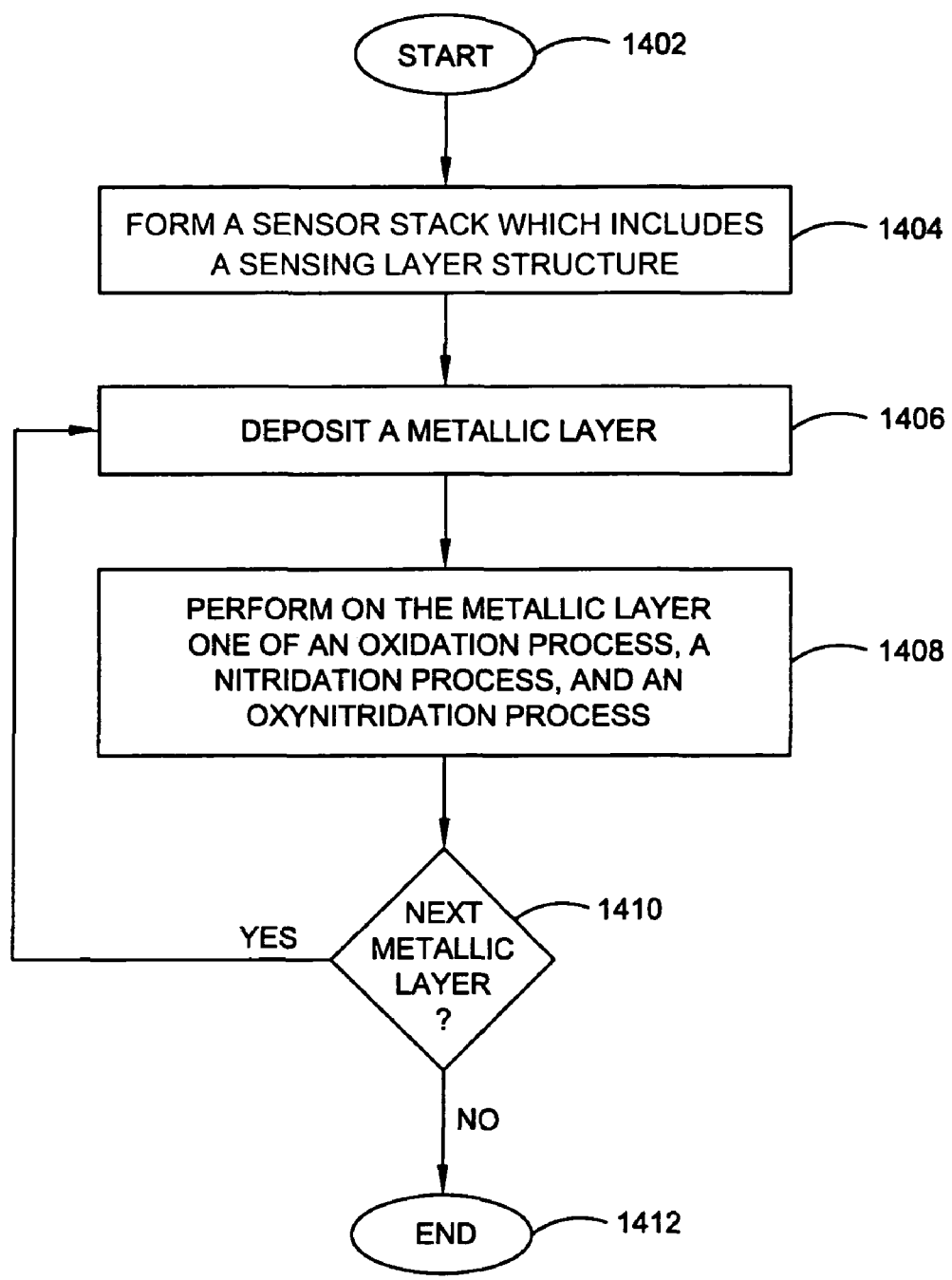
FIG. 14 is a flowchart which describes a method of making a sensor having a insulator structure of the present application.

FIG. 14 is a flowchart which describes an exemplary embodiment of a method of forming capping layer structures of the present application. The steps shown and described in the flowchart of FIG. 14 correspond to the cross-sectional view structures of FIGS. 15-21. Note that the method of FIG. 14 may be performed with use of a system that will be described later.

Figure 15:
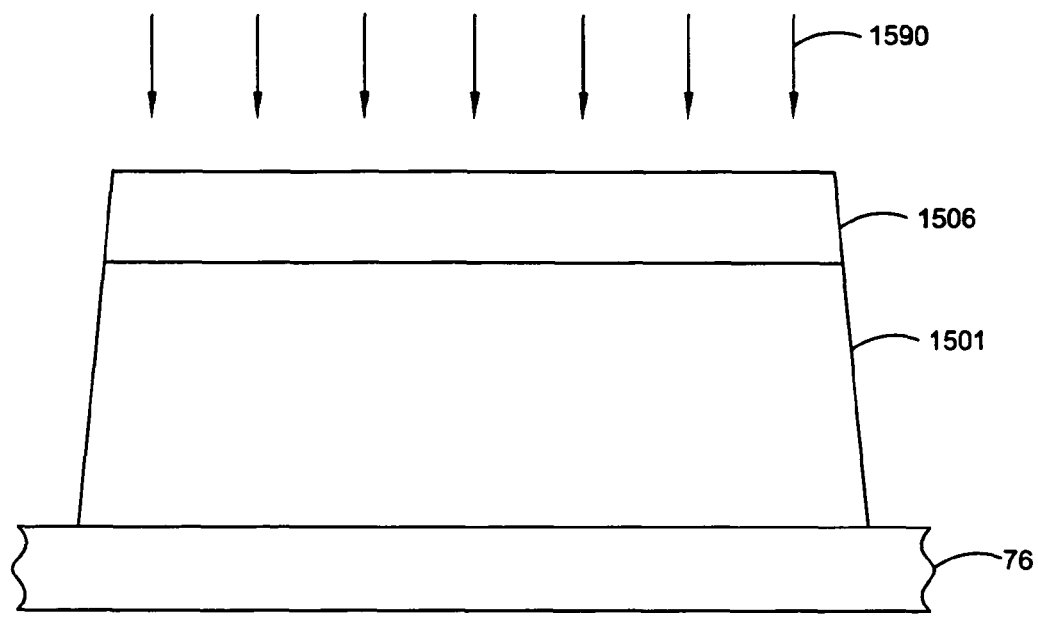
FIGS. 15-21 are cross-sectional views illustrating partially formed structures of a sensor having a capping layer structure corresponding to the method of FIG. 14.

Beginning at a start block 1402 of FIG. 14, as well as FIG. 15, a sensor stack structure 1501 having a sensing layer structure 1506 is formed over a substrate (step 1404 of FIG. 14). The substrate may be first dielectric gap layer 76 for an SV sensor of a magnetic head of the present application. Sensor stack structure 1501 may include all sensor stack layers described in relation to FIG. 12. However, one skilled in the art understands that the layers described in relation to FIG. 12 are but one example of possible sensor layer configurations.

In steps 1406, 1408, and 1410 of FIG. 14, a capping layer structure of the present application (such as that described in relation to FIG. 12) is formed. The detailed steps of the formation of this capping layer structure are now described. Using a deposition process 1590 in FIG. 15, metallic materials of a capping layer structure are deposited over and in contact with sensing layer structure 1506 (step 1406 of FIG. 14). The result is a metallic sublayer 1604 of the capping layer structure shown in FIG. 16. Preferably, the deposition process is a physical vapor deposition process (PVDP) performed in a deposition chamber module. In this exemplary embodiment, the deposition process of metallic sublayer 1604 is accomplished in an atmosphere of argon (Ar) with a sputtering flow of 20 standard cubic centimeters (sccm). In addition, the metal used for metallic sublayer 1604 is tantalum (Ta). The deposition process may alternatively be any suitable thin film deposition process, such as ion beam sputtering, evaporation or another similar method. Furthermore, any other suitable metal or combinations of metals may be substituted for Ta in metallic sublayer 1604 as described in relation to FIG. 12. Also, any suitable thickness of metallic sublayer 1604 may be used, as described in relation to FIG. 12.

Figure 16:
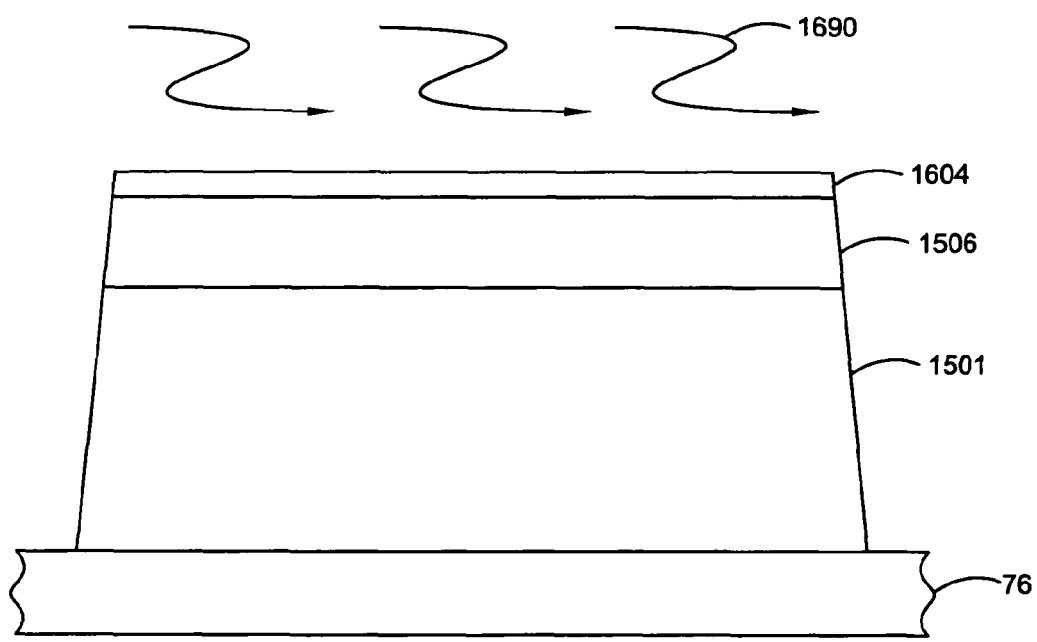
Figure 17:
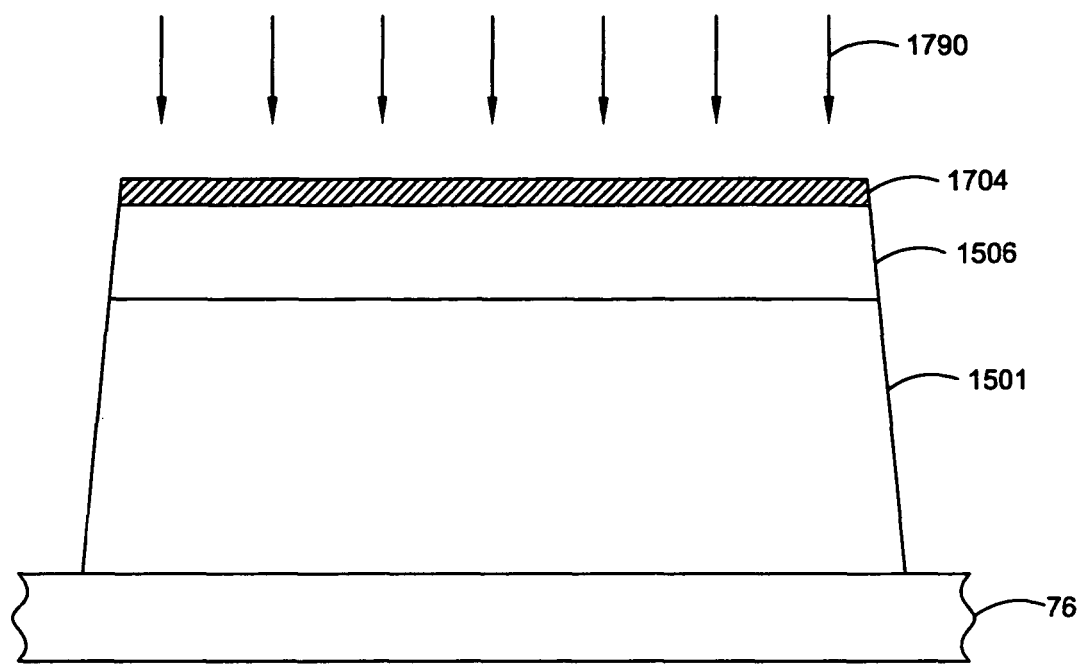

Once the desired thickness of metallic sublayer 1604 is achieved, the gas is evacuated from the deposition chamber module. The work-in-progress is then moved, maintaining a vacuum, to an in-situ oxidization module. In the in-situ oxidization module, an oxidation process 1690 of FIG. 16 is performed on metallic sublayer 1604 (step 1408 of FIG. 14). As a result, in FIG. 17 an oxidized metallic sublayer 1704, having a thickness of about 16⅔ Å, of the capping layer structure is shown in lieu of the pure metallic sublayer. The oxidation process is preferably an in-situ plasma oxidation process, which is suitably controlled and timed such that a sufficiently oxidized tantalum oxide layer with uniform atomic percent oxygen throughout the layer from top to bottom is achieved.

The reactant gas used in the oxidation process preferably includes oxygen having a flow of 4 sccm and argon having a flow of 20 sccm. The oxidation process for about a 16⅔ Å Ta layer may be performed for 1 min. at room temperature. The RF power applied to the substrate is 20 watts (W). The flow of oxygen in the reactant gas may vary from about 2 sccm to about 10 sccm and RF power may vary from 10 W to 40 W, for example. Further, the oxidation process may be performed from about 4 min. to about 6 min. corresponding to a range of metallic sublayer thicknesses from about 1 Å to about 10 Å. The oxidation process may alternatively utilize any suitable oxidation process such as natural oxidation, radical shower oxidation, or reactive sputtering oxidation.

Next, it is identified whether steps 1406 and 1408 need to be repeated (step 1410 of FIG. 14). This will depend on the number of oxidized metallic sublayers desired. Repeating steps 1406 and 1408 forms a laminated layer structure, and more specifically the plurality of oxidized metallic sublayers shown and described earlier in relation to FIG. 12.

Figure 18:
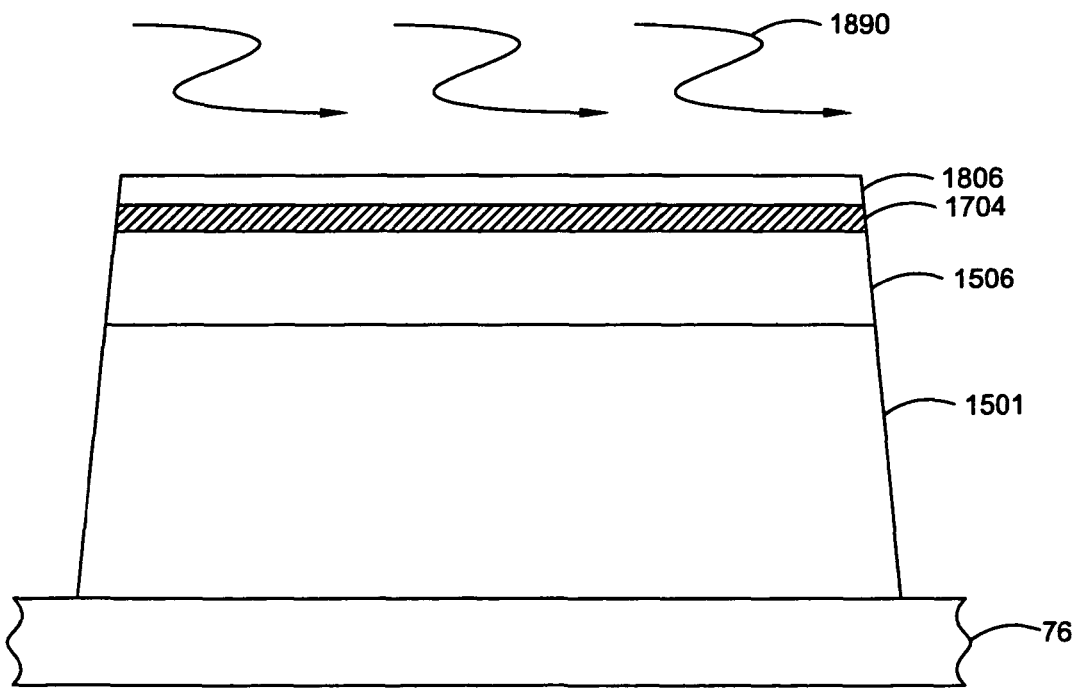

In this exemplary embodiment, steps 1406 and 1408 are repeated two (2) subsequent times to produce a total of three (3) sublayers in the structure. In a repeated deposition process 1790 of FIG. 17, metallic materials of the capping layer structure are deposited over and adjacent oxidized metallic layer 1704 (repeated step 1406 of FIG. 14). Preferably, this deposition process is the same deposition process using the same metallic materials utilized in deposition process 1590 of FIG. 15. The result is shown in FIG. 18 where a metallic sublayer 1806 is formed over oxidized metallic sublayer 1704. A repeated oxidization process 1890 is then performed to transform metallic sublayer 1806 into an oxidized metallic sublayer 1906 shown in FIG. 19 (repeated step 1408 of FIG. 14). Preferably, this oxidization process is the same oxidization process using the same components utilized in oxidization process 1690 of FIG. 16.

Figure 19:
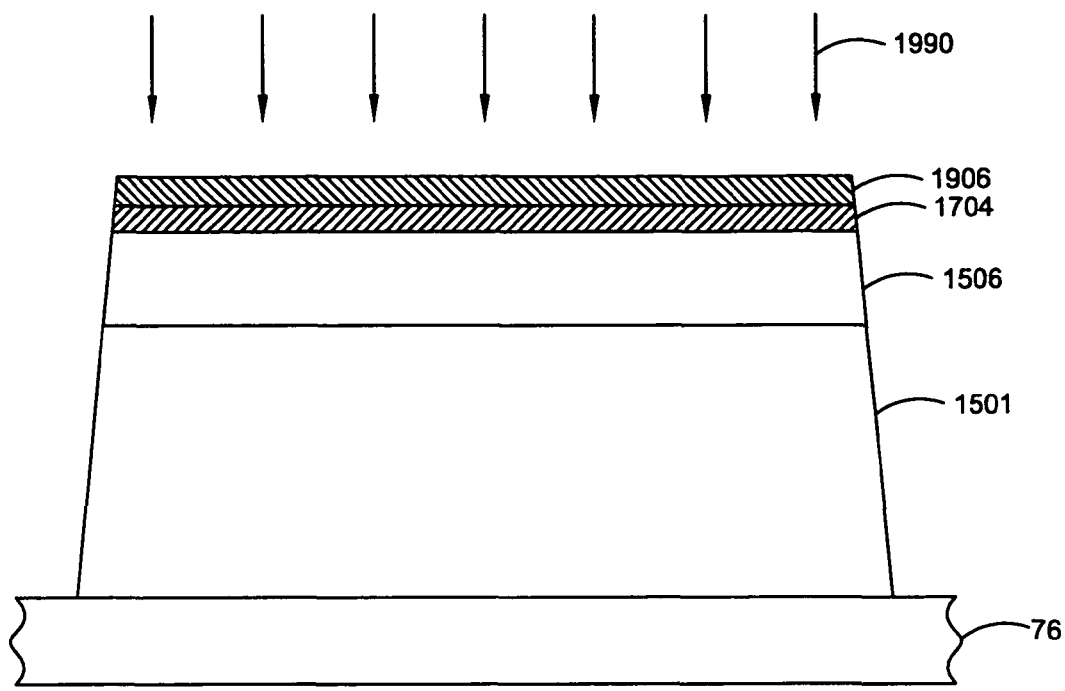
Figure 20:
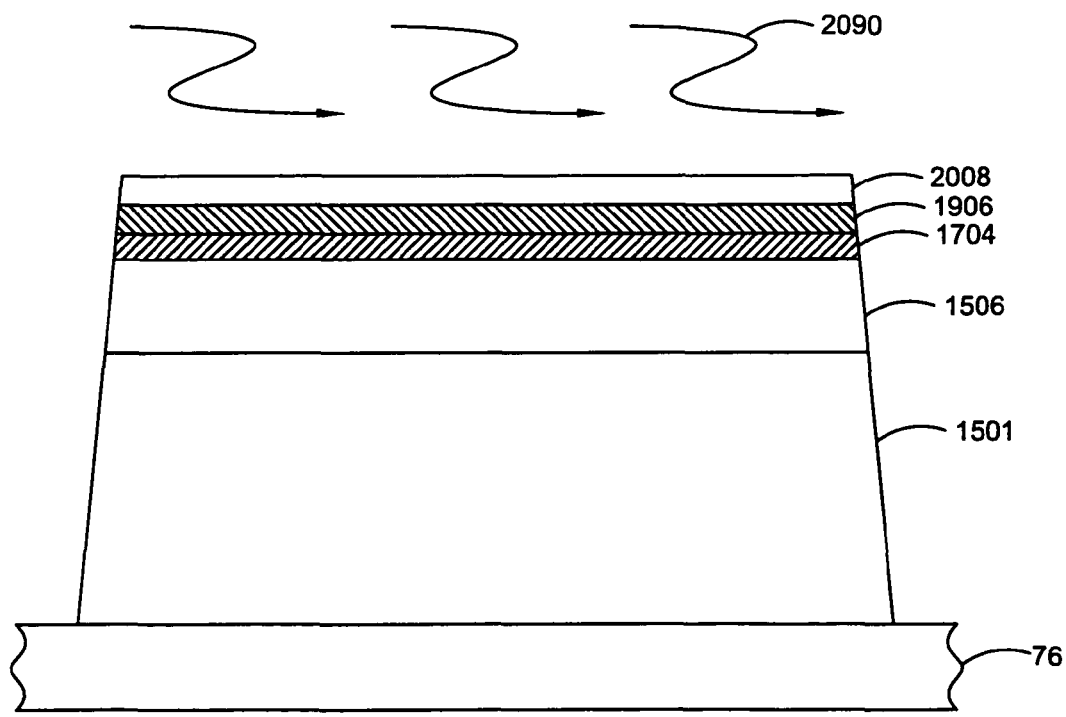
Figure 21:
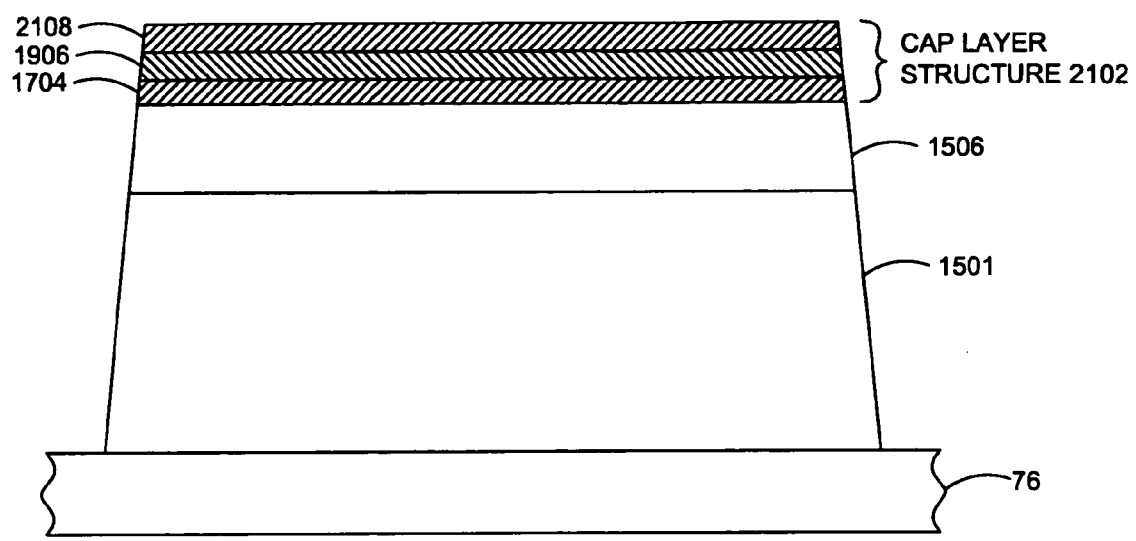

In a further repeated deposition process 1990 of FIG. 19, metallic materials of the capping layer structure are deposited over and adjacent oxidized metallic layer 1906 (further repeated step 1406 of FIG. 14). Preferably, this deposition process is the same deposition process using the same metallic materials utilized in deposition process 1590 of FIG. 15 and deposition process 1790 of FIG. 17. The result is shown in FIG. 20 where a metallic sublayer 2008 is formed over oxidized metallic sublayer 1906. A further repeated oxidization process 2090 is then performed to transform metallic sublayer 2008 into an oxidized metallic sublayer 2108 shown in FIG. 21 (further repeated step 1408 of FIG. 14). Preferably, this oxidization process is the same oxidization process using the same components utilized in oxidization process 1690 of FIG. 16 and oxidization process 1890 of FIG. 18.

As a result, a capping layer structure 2102 is formed with a plurality of three oxidized metallic sublayers 1704, 1906, and 2108. In this embodiment, capping layer structure 2102 has a resulting thickness of about 50 Å. The flowchart ends at an end block 1412, where subsequent processing steps to complete the manufacture of the sensor and the magnetic head using conventional or other processes may be utilized. The result is a SV sensor of the type described in relation to FIG. 12, for example. The same or similar techniques may be utilized to produce the MTJ sensor of FIG. 13, or alternatively an MRAM.

The total thickness of the capping layer structure, the sublayer thickness, the number of sublayers, the materials of each sublayer, and the processing of each sublayer may be chosen by design to achieve the specular reflective capping layer structure and give suitable desired effects on the magnetoresistive effect and other soft magnetic properties of the sensor. As the thicknesses of the sublayers may vary per the design, it is desired that any such process will oxidize each sublayer sufficiently from top to bottom without over-oxidizing in step 1408 of FIG. 14. Thus, the variables for sufficient oxidization of each sublayer (e.g. time, flow rate, and power) are preferably selected and confirmed through empirical analysis prior to large-scale manufacturing. In particular, the values of the variables (e.g. time, flow rate, and power) which correspond to desired or optimal sensor performance are those selected for the oxidization step 1408 of FIG. 14 for large-scale manufacturing.

Figure 1:
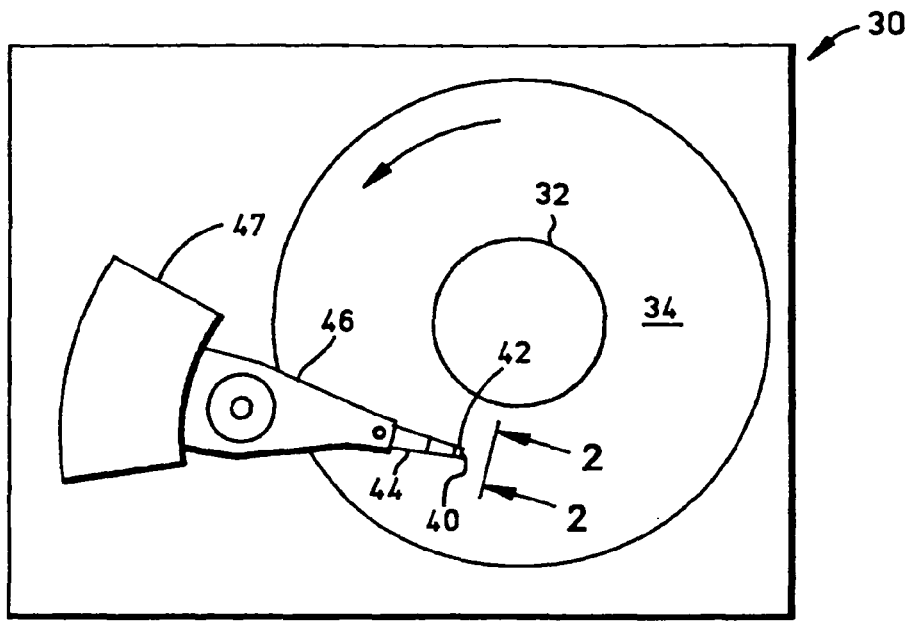
FIG. 1 is a plan view of an exemplary magnetic disk drive.
Figure 2:
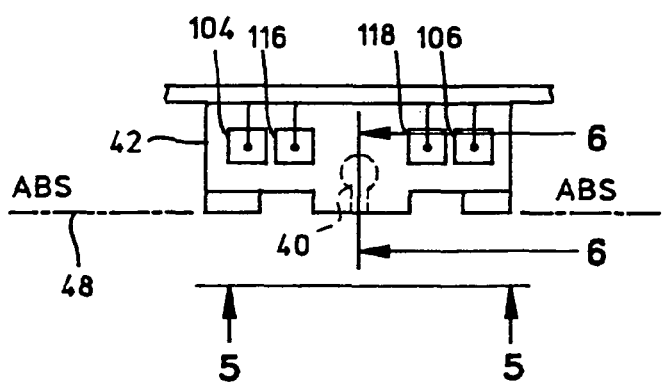
FIG. 2 is an end view of a slider with a magnetic head of the disk drive as seen in plane 2-2 of FIG. 1.
Figure 3:
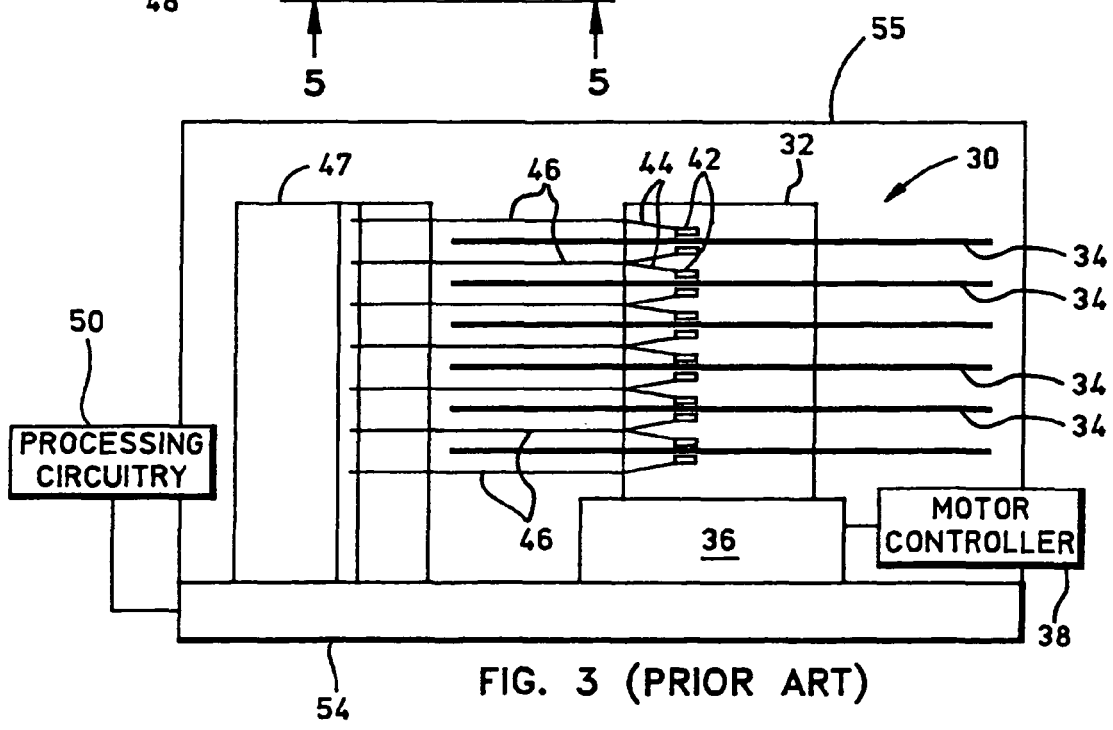
FIG. 3 is an elevation view of the magnetic disk drive wherein multiple disks and magnetic heads are employed.
Figure 4:
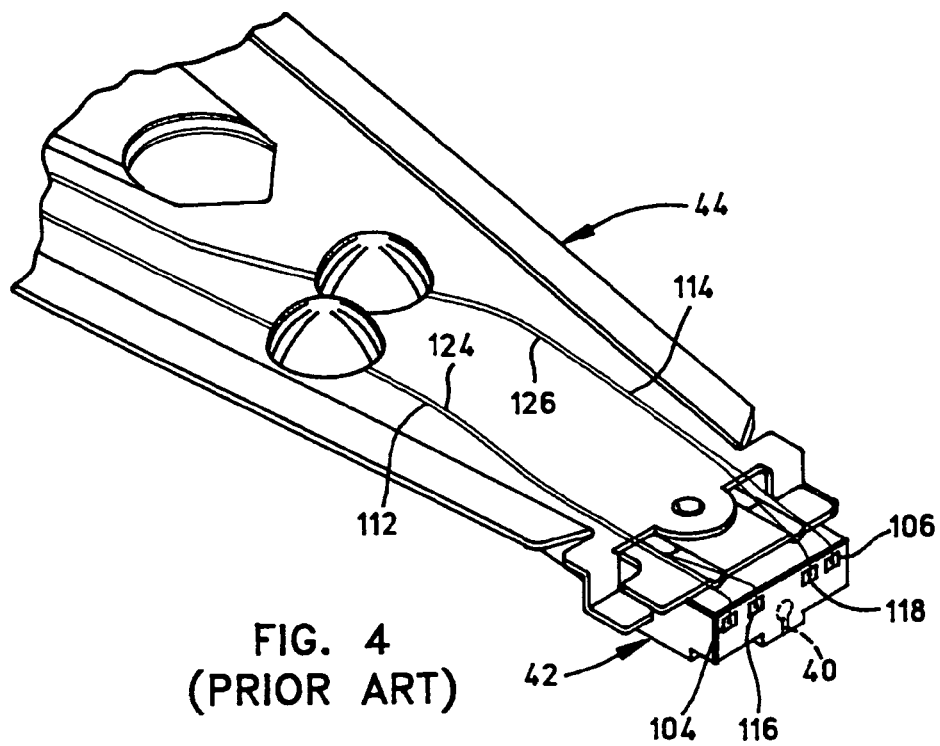
FIG. 4 is an isometric illustration of an exemplary suspension system for supporting the slider and magnetic head.
Figure 5:
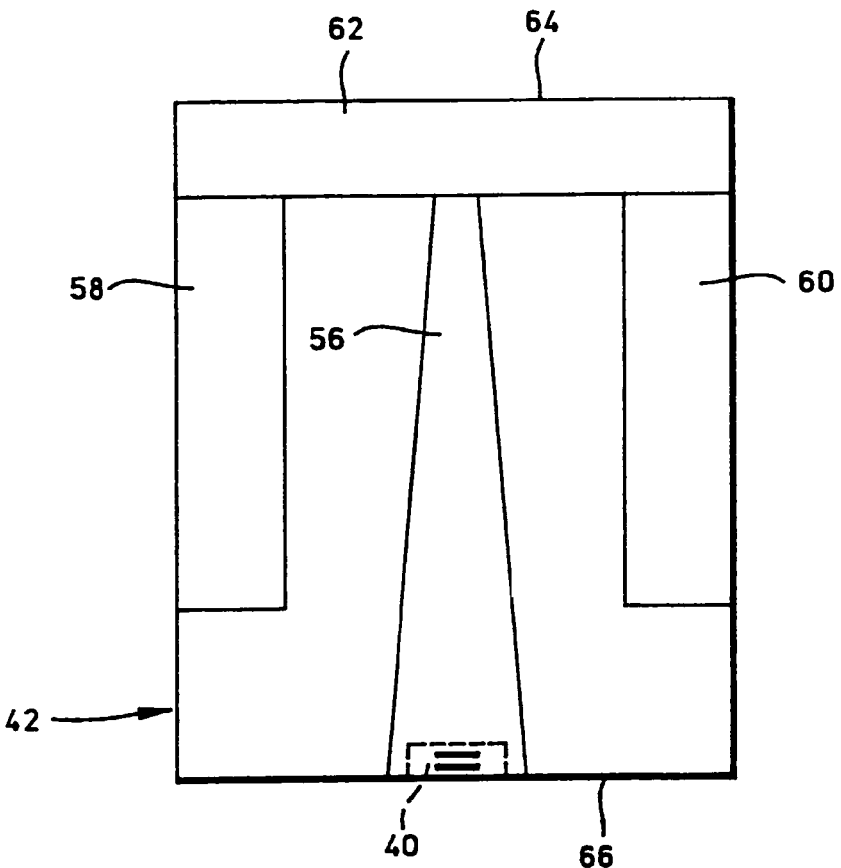
FIG. 5 is an air bearing surface (ABS) view of the magnetic head taken along plane 5-5 of FIG. 2.
Figures 6, 7, 8:
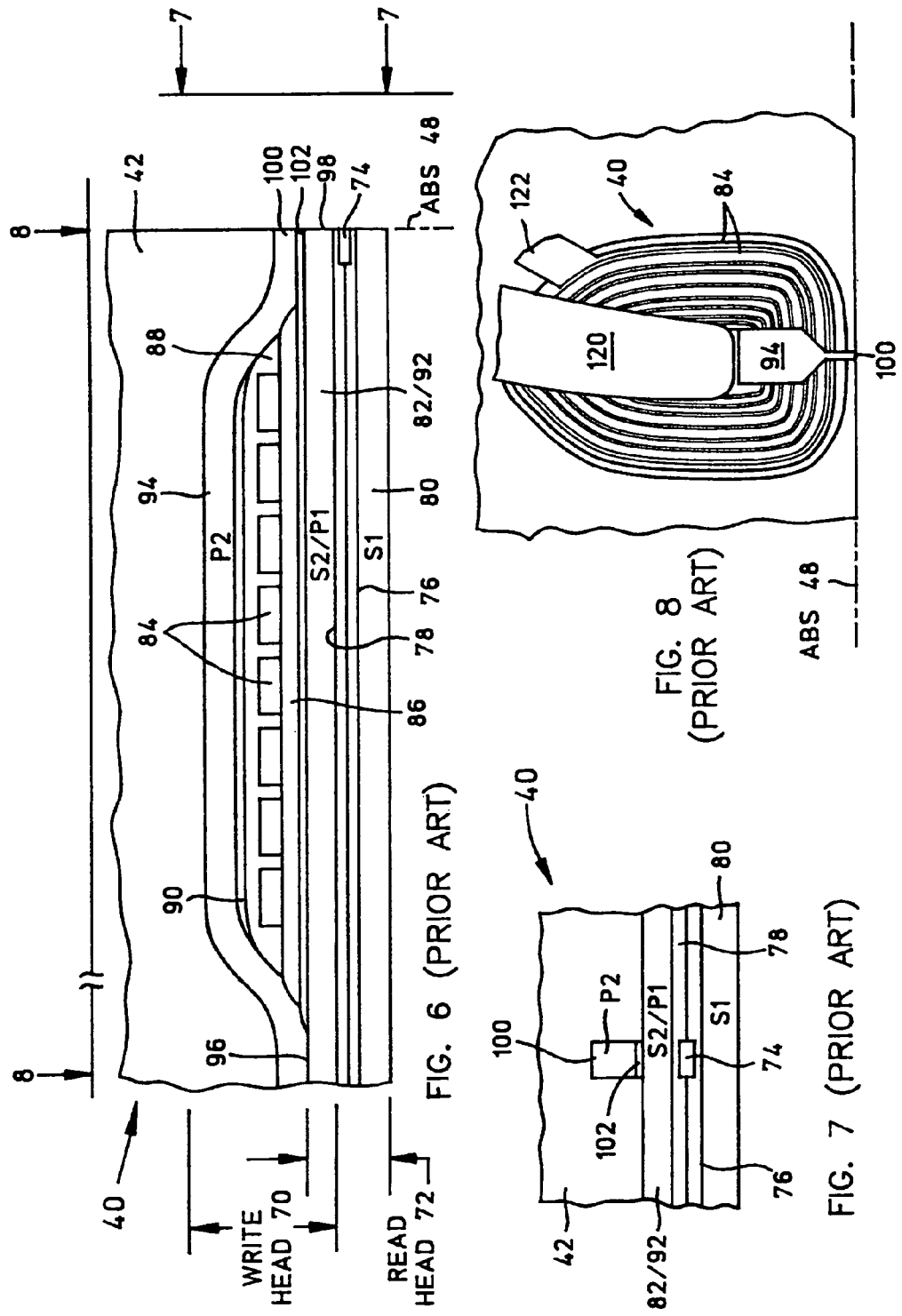
FIG. 6 is a partial view of the slider and a merged magnetic head as seen in plane 6-6 of FIG. 2.
FIG. 7 is a partial ABS view of the slider taken along plane 7-7 of FIG. 6 to show the read and write elements of the merged magnetic head.
FIG. 8 is a view taken along plane 8-8 of FIG. 6 with all material above the coil layer and leads removed.
Figure 9:
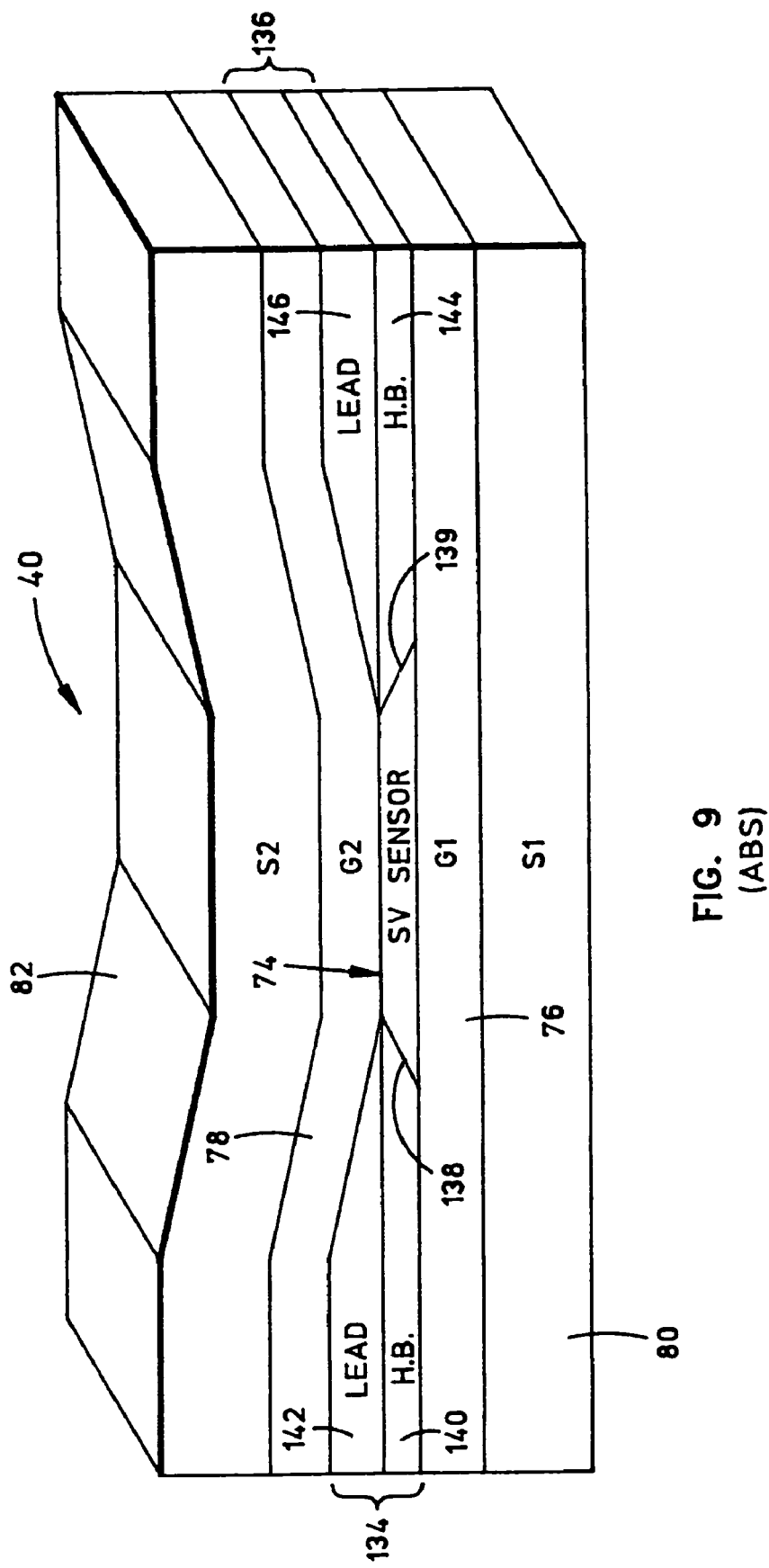
FIG. 9 is an enlarged isometric illustration of a read head having a spin valve (SV) sensor.
Figure 10:
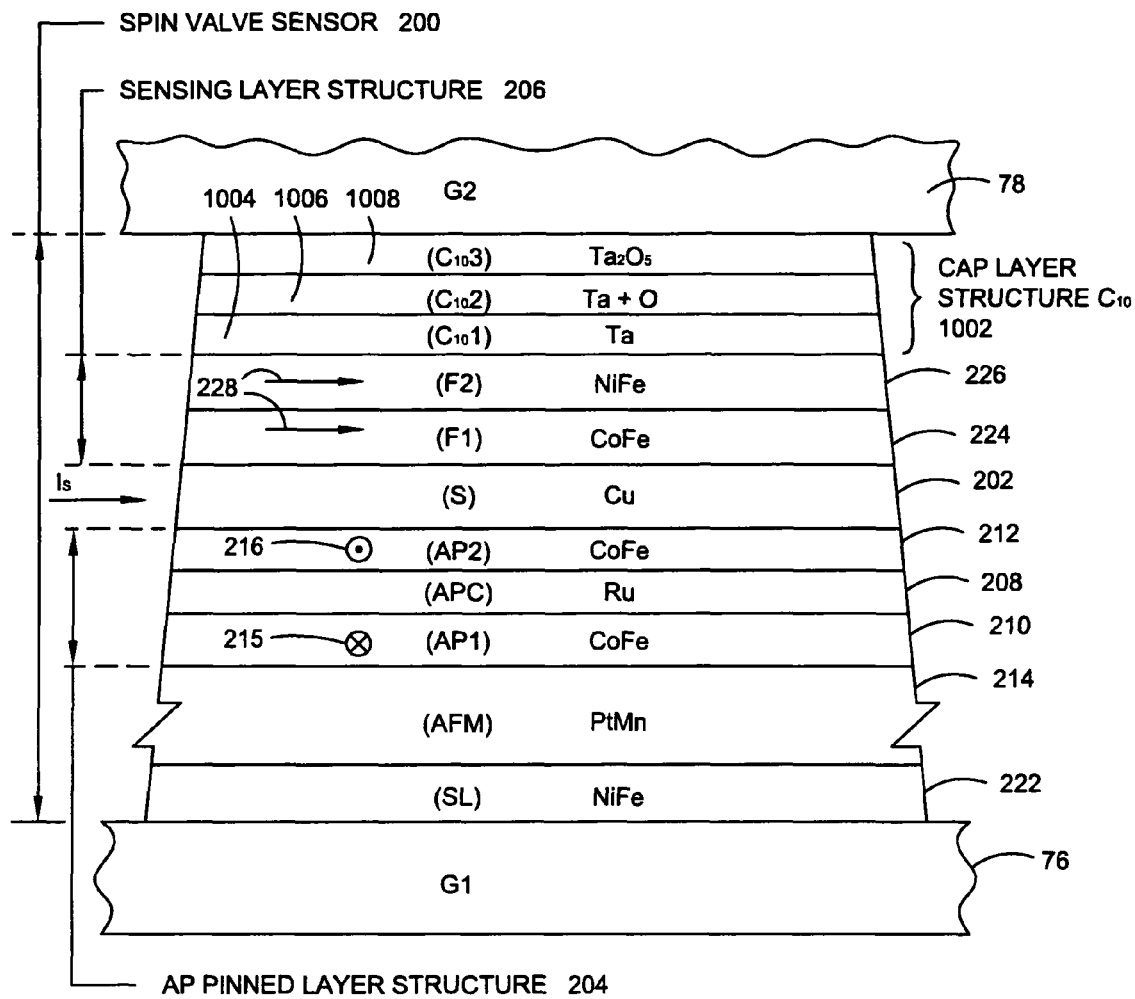
FIG. 10 is an ABS illustration of a typical multi-layer structure of a current-in-plane (CIP) type SV sensor having a capping layer structure.

As an optional step in the method of FIG. 10, a diffusion barrier layer is deposited over the sensing layer structure before the first time that a metallic sublayer is deposited in step 1406 of FIG. 14. This diffusion barrier layer was described previously in relation to FIG. 12.

Note that the oxidation process associated with step 1408 of FIG. 14 may alternatively be a nitridation process or an oxynitridation process. In the case of the nitridation process, a metal nitride is formed. The nitridation process preferably is an in-situ plasma nitridation process, where a sufficiently nitrided metal layer with uniform atomic percent nitrogen is formed. The nitridation of a metallic layer by the nitridation process is suitably controlled and timed such that a sufficiently nitrided tantalum nitride layer with uniform atomic percent nitrogen throughout the layer from top to bottom is achieved. The nitridation process may alternatively be any suitable nitridation process such as natural nitridation, radical shower nitridation, or reactive sputtering nitridation. These processes may be performed in-situ with other processing steps.

In the case of the oxynitridation process, a metal oxynitride is formed. The oxynitridation process preferably is an in-situ plasma oxynitridation process, where a sufficiently oxynitrided metal layer with uniform atomic percent oxygen and uniform atomic percent nitrogen is formed. The oxynitridation of a metallic layer by the oxynitridation process is suitably controlled and timed such that a sufficiently oxynitrided tantalum oxynitride layer with uniform atomic percent oxygen and uniform atomic percent nitrogen throughout the layer from top to bottom is achieved. The oxynitridation process may alternatively be any suitable oxynitridation process, such as natural oxynitridation, radical shower oxynitridation, or reactive sputtering oxynitridation. These processes may be performed in-situ with other processing steps.

A DC magnetron system suitable for use in the method corresponding to the steps of FIG. 14 may be sold by Anelva Technix Corporation of Japan. Alternatively, an magnetron/ion beam sputtering system may be purchased from Veeco Corporation of Plainview, N.Y.

Final Comments. A magnetic sensing device for use in a magnetic head includes a sensor stack structure having a sensing layer structure and an insulator structure formed adjacent the sensing layer structure. The insulator structure includes a plurality of (in-situ) oxidized metallic sublayers, a plurality of (in-situ) nitrided metallic sublayers, or a plurality of (in-situ) oxynitrided metallic sublayers. The insulator structure may be a capping layer structure of a giant magnetoresistance (GMR) sensor or, alternatively, a tunnel barrier layer structure of a tunneling magnetoresistance (TMR) sensor or a magnetic random access memory (MRAM). Advantageously, each treated metallic sublayer is sufficiently uniformly treated so as to increase the magnetoresistive effect and improve soft magnetic properties of the magnetic sensing device. Each sublayer may have the same composition and thickness, or alternatively vary in composition and thickness.

A method for use in forming the magnetic sensing device of the present application includes the steps of forming a sensor stack structure which includes a sensing layer structure; depositing a metallic layer; performing, on the metallic layer, either an oxidation, nitridation, or oxynitridation process; and repeating the steps of depositing and performing one or more times to thereby form an insulator structure.

A disk drive of the present invention includes a housing; a magnetic disk rotatably supported in the housing; a magnetic head assembly; a support mounted in the housing for supporting the magnetic head assembly so as to be in a transducing relationship with the magnetic disk; a spindle motor for rotating the magnetic disk; an actuator positioning means connected to the support for moving the magnetic head assembly to multiple positions with respect to said magnetic disk; and a processor connected to the magnetic head assembly, to the spindle motor, and to the actuator for exchanging signals with the magnetic head assembly for controlling movement of the magnetic disk and for controlling the position of the magnetic head assembly. The magnetic head assembly includes a read head having a magnetic sensing device which includes a sensor stack structure having a sensing layer structure; an insulator structure formed adjacent the sensing layer structure; and the insulator structure comprising one of a plurality of oxidized metallic sublayers, a plurality of nitrided metallic sublayers, and a plurality of oxynitrided metallic sublayers.

It is to be understood that the above is merely a description of preferred embodiments of the invention and that various changes, alterations, and variations may be made without departing from the true spirit and scope of the invention as set for in the appended claims. The insulator structures and methods of making the same of the present application are described in relation to capping layer structures and tunnel barrier layer structures in magnetic sensing devices as examples. However, the insulator structures and methods of making the same are viable for use in other locations of magnetic sensing devices, as well as other devices all together. Few if any of the terms or phrases in the specification and claims have been given any special meaning different from their plain language meaning, and therefore the specification is not to be used to define terms in an unduly narrow sense.

What is claimed is:

1. A method of forming a magnetic sensing device, comprising:
    forming a sensor stack structure of the magnetic sensing device, the sensor stack structure including a sensing layer structure;
    forming a capping layer structure of the magnetic sensing device by:
        depositing a first metallic layer comprising a metal;
        performing, on the first deposited metallic layer, a process comprising one of oxidation, nitridation, and oxynitridation, to convert the first deposited metallic layer into a first insulator layer;
        after converting the first deposited metallic layer into the first insulator layer, depositing, on the first insulator layer, a second metallic layer comprising the same metal as the first metallic layer; and
        performing, on the second deposited metallic layer, the process utilized on the first deposited metallic layer, to convert the second deposited metallic layer into a second insulator layer, for thereby forming the capping layer structure which includes the first and the second insulator layers.

2. The method of claim 1, wherein the metal comprises tantalum (Ta).

3. The method of claim 1, wherein the process utilized on the first deposited metallic layer further comprises one of in-situ oxidation, in-situ nitridation, and in-situ oxynitridation.

4. The method of claim 1, wherein the process utilized on the first deposited metallic layer further comprises one of a natural process, a radical shower process, a plasma process, and a reactive sputtering process.

5. The method of claim 1, wherein the process utilized on the first deposited metallic layer further comprises one of: oxidation to fully oxidize the first deposited metallic layer from top to bottom, nitridation to fully nitridize the first deposited metallic layer from top to bottom, and oxynitridation to fully oxynitridize the first deposited metallic layer from top to bottom.

6. The method of claim 1, wherein the process utilized on the first deposited metallic layer comprises oxidation, the first insulator layer is a first fully-oxidized metal layer, and the second insulator layer is a second fully oxidized metal layer.

7. The method of claim 1, further comprising:
    depositing, on the second insulator layer, a third metallic layer comprising the same metal as the first and the second metallic layers; and
    performing, on the third deposited metallic layer, the process utilized on the first and the second deposited metallic layers, to convert the third deposited metallic layer into a third insulator layer, which thereby forms the capping layer structure having the first, the second, and the third insulator layers.

8. The method of claim 1, wherein the capping layer structure has uniform atomic percent oxygen, or nitrogen, throughout from top to bottom.

9. The method of claim 1, wherein the capping layer structure has uniform atomic percent oxygen throughout from top to bottom.

10. The method of claim 1, wherein the capping layer structure is formed as $Ta_2O_5$ throughout from top to bottom.

11. The method of claim 1, wherein the first insulator layer is in contact with the second insulator layer.

12. The method of claim 1, wherein the magnetic sensing device is utilized in a magnetic memory cell.

* * * * *